(12) United States Patent
Pagani

(10) Patent No.: US 8,358,147 B2
(45) Date of Patent: Jan. 22, 2013

(54) TESTING INTEGRATED CIRCUITS

(75) Inventor: Alberto Pagani, Nova Milanese (IT)

(73) Assignee: STMicroelectronics S.r.l., Agrate Brianza (MI) (IT)

( * ) Notice: Subject to any disclaimer, the term of this patent is extended or adjusted under 35 U.S.C. 154(b) by 0 days.

(21) Appl. No.: 12/982,753

(22) Filed: Dec. 30, 2010

(65) Prior Publication Data

US 2011/0291679 A1 Dec. 1, 2011

Related U.S. Application Data

(63) Continuation-in-part of application No. 12/398,148, filed on Mar. 4, 2009.

(30) Foreign Application Priority Data

Mar. 5, 2008 (IT) ............................. MI2008A0365

(51) Int. Cl.
*G01R 31/02* (2006.01)
(52) U.S. Cl. ................................ 324/762.02
(58) Field of Classification Search .................. None
See application file for complete search history.

(56) References Cited

U.S. PATENT DOCUMENTS

| | | | | |
|---|---|---|---|---|
| 1,465,395 | A * | 8/1923 | Jammer | 370/241 |
| 4,626,775 | A | 12/1986 | Cho et al. | |
| 6,466,007 | B1 * | 10/2002 | Prazeres da Costa et al. | 324/762.02 |
| 6,917,213 | B2 | 7/2005 | Oosawa et al. | |
| 7,679,391 | B2 | 3/2010 | Watanabe et al. | |
| 7,960,189 | B2 * | 6/2011 | Cauvet et al. | 438/15 |

FOREIGN PATENT DOCUMENTS

WO WO 2007010480 A2 * 1/2007

OTHER PUBLICATIONS

Office Action from U.S. Appl. No. 12/398,148 dated Sep. 23, 2011.
Office Action from U.S. Appl. No. 12/398,148 dated Mar. 16, 2012.

* cited by examiner

*Primary Examiner* — Paresh Patel
(74) *Attorney, Agent, or Firm* — Wolf, Greenfield & Sacks, P.C.

(57) ABSTRACT

A method of testing integrated circuits is provided. The method includes establishing at least one first physical communication channel between a test equipment and a respective group of integrated circuits under test by having probes of the test equipment contacting at least one corresponding physical contact terminal of each integrated circuit of the respective group. The method further includes having the test equipment exchanging, over the at least one first physical communication channel, the same test stimuli with each integrated circuit of the group. The method still further includes having each integrated circuit of the group establishing a corresponding second physical communication channel with the test equipment by having at least one physical contact terminal of the integrated circuit contacted by a corresponding probe of the test equipment. The method further includes having each integrated circuit of the group exchanging, over the second physical communication channel, a corresponding test response signal based on the received test stimuli with the test equipment. The test stimuli are exchanged by modulating at least one first carrier wave based on the test stimuli; the at least one first carrier wave has at least one first frequency. The test response signals of each integrated circuit of the group are exchanged by modulating at least one respective second carrier wave based on the test response signals; each second carrier wave have at least one respective second frequency.

36 Claims, 23 Drawing Sheets

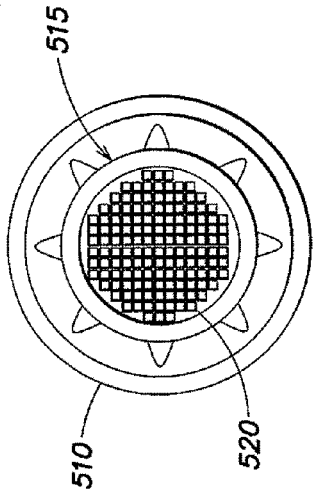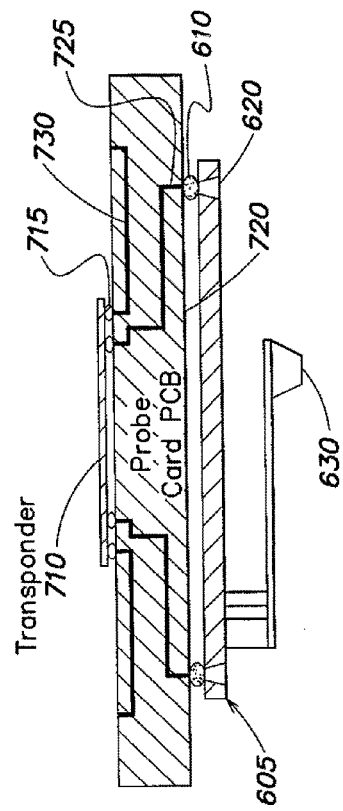
FIG. 6A
FIG. 6B
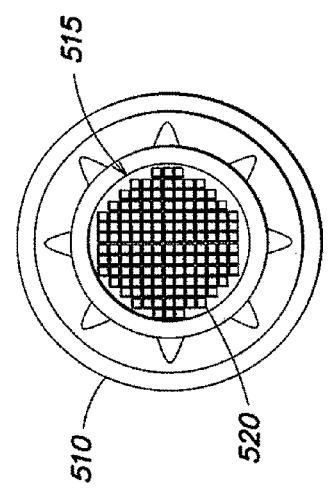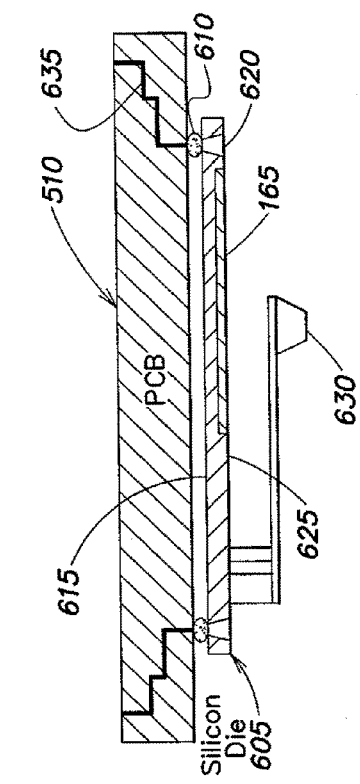
FIG. 7A
FIG. 7B

TESTING INTEGRATED CIRCUITS

CROSS REFERENCE TO RELATED APPLICATIONS

This application is a continuation-in-part of U.S. application Ser. No. 12/398,148, filed Mar. 4, 2009 entitled "TESTING INTEGRATED CIRCUITS USING FEW TEST PROBES", which application claims the priority benefit of Italian patent application number MI2008A00365, filed on Mar. 5, 2008, entitled "TESTING INTEGRATED CIRCUITS EXPLOITING FEW TEST PROBES," which is hereby incorporated by reference to the maximum extent allowable by law.

BACKGROUND OF THE INVENTION

1. Field of the Invention

The present invention relates to the field of Integrated Circuits (ICs), and particularly to methods and systems for IC testing.

2. Discussion of the Related Art

ICs are typically manufactured many at a time in the form of dies on a semiconductor material wafer. After manufacturing, the semiconductor wafer is diced, so as to obtain a plurality of individual IC chips.

Before being packaged and shipped to the customers, and installed in various electronic systems, the individual ICs need to be tested for assessing their functionality, and in particular for ensuring that they are not defective, that they respect prescribed specifications, and that they work properly. In particular, during the test, information regarding global or local physical faults (such as the presence of undesired short circuits and break-down events) of the IC integrated on each die are obtained, and, more generally, the proper operation thereof is detected (for example, by checking the waveform of one or more output signals of the IC in response to predetermined stimuli). Only those dies with ICs that meet predetermined requirements can proceed to the subsequent manufacturing phases (such as wire bonding, packaging and final testing).

According to a known testing technique, the IC dies are tested before the semiconductor wafer is diced into the individual chips. The test conducted at the wafer level is referred to as "wafer sort" or "Electrical Wafer Sort" ("EWS").

For example, in case of non-volatile semiconductor memory devices (such as Flash memories) the EWS test is performed on each die on which the memory device is integrated, in order to assess the correct operation thereof, e.g. to detect possible defective memory cells.

For performing the test, a tester is used which is coupled to the semiconductor wafer containing the IC dies to be tested, by means of a probe card which is used for interfacing the semiconductor wafer to the tester.

The tester is adapted to manage signals that are employed for performing the test. Hereinafter, such signals will be referred to as "test signals" and are intended to include test stimuli (e.g., commands, addresses of memory locations of the memory device to be accessed in read or write, data to be written into the memory device) which are generated by the tester and which are sent, by means of the probe card, to each die to be tested, and test response signals (e.g., data read from the memory device) which are generated by the ICs integrated on each die under test in response to the received test stimuli. The test response signals are sent by the IC integrated on each die under test to the tester, which processes them to derive an indication of the proper or improper operation of the ICs in the dies under test.

Often (for example during the EWS), the electrical coupling of the probe card with the ICs on the dies to be tested, necessary for achieving the signals exchange, is accomplished through probes adapted to establish a physical (mechanical and electrical) contact with corresponding contact pads on the ICs. For this purpose, the probe card includes of a PCB (Printed Circuit Board), which is connected to a large number (even of the order of some thousands) of mechanical probes, which are adapted to physically contact input/output contact pads of each die to be tested.

However, this type of test system has several limitations.

For example, there is the risk of damaging the contact pads of the dies under test. As known, a contact pad includes of an enlarged metallization region of the IC; when the tip of the mechanical probes touches the pads, there is always the risk that one or more of the pads are damaged by scrubbing, and the likelihood that this happens increases with the number of probes.

Also, the parallel-testing capability is relatively low: indeed, when several dies at a time have to be tested, the number of mechanical probes significantly increases; fabricating probe cards with many probes is not an easy task, and the finite dimensions of the probes pose a physical limit to the density of probes per unit area.

Moreover, the higher the number of probes required, the more probable it is that the electrical contacts between the pads of the ICs under test and the mechanical probes are not good, and electrical discontinuities may take place, which affect the test results.

Furthermore, when the contact pads are very close to each other (a situation frequently encountered due to the constant increase in integration scale and size shrinking), it is very difficult to ensure a good physical contact of the mechanical probes with the contact pads. Such a problem is emphasized when the pads are small in size and/or a large number thereof is present on each die.

In addition, the mechanical probes are very expensive, thus producing probe cards with several probes negatively contributes to the increase of the overall cost of the test system, and eventually of the ICs.

The U.S. Pat. No. 7,546,501 describes a method and apparatus for using a device's power and ground terminals as a test and/or debug interface for the device. According to this patent, messages are modulated over DC voltages applied to the power terminals of a device to input test/debug messages to the device and output test/debug messages from the device. This allows a device to be tested and/or debugged without the device having any shared or dedicated test or debug interface terminals. However, since according to this solution the transmission of the input and output test/debug messages is performed with transmitters and receivers that are equal to each other, and since the ICs share the same resources for the communication with the tester, it is necessary to provide a message traffic policy for avoiding message collisions. Specifically, said message traffic policy provides for the introduction in each IC of a corresponding personal identifier and a group identifier; this operation is carried out during a preliminary test phase. This constraint heavily reduces the communication efficiency, sensibly increasing test time and test costs. The most penalized tests are those exploiting the scan chains, wherein data (test vectors and signatures) are transmitted and received at the same time, requiring thus a full duplex transmission for all ICs that are sharing the resources.

In this case, indeed, only one single IC at a time may communicate with the tester (and, thus, be tested).

SUMMARY OF THE INVENTION

The Applicant has tackled the problem of overcoming these and other problems.

The Applicant has found that a way to reduce the number of probes necessary to perform the test of an IC is to employ a mixing of multiple test stimuli and/or test response signals over the same physical communication channel between the probe card and an IC under test.

Specifically, according to an embodiment of the present invention, a method of testing integrated circuits is provided. The method comprises establishing at least one first physical communication channel between a test equipment and a respective group of integrated circuits under test by having probes of the test equipment contacting at least one corresponding physical contact terminal of each integrated circuit of the respective group. The method further comprises having the test equipment exchanging, over said at least one first physical communication channel, the same test stimuli with each integrated circuit of the group. The method still further comprises having each integrated circuit of the group establishing a corresponding second physical communication channel with the test equipment by having at least one physical contact terminal of the integrated circuit contacted by a corresponding probe of the test equipment. The method further comprises having each integrated circuit of the group exchanging, over said second physical communication channel, a corresponding test response signal based on the received test stimuli with the test equipment. The test stimuli are exchanged by modulating at least one first carrier wave based on said test stimuli; said at least one first carrier wave has at least one first frequency. The test response signals of each integrated circuit of the group are exchanged by modulating at least one respective second carrier wave based on said test response signals; each second carrier wave have at least one respective second frequency.

Another aspect of the present invention provides for a corresponding test equipment.

BRIEF DESCRIPTION OF THE DRAWINGS

These and other features and advantages of the present invention will be made apparent by the following detailed description of an embodiment thereof, provided merely by way of non-limitative example, description that will be conducted making reference to the attached drawings, wherein:

FIGS. 6A and 6B partially shows a cross-sectional view of a probe card according to an embodiment of the present invention;

FIGS. 7A and 7B partially shows a cross-sectional view of a probe card according to another embodiment of the present invention;

DETAILED DESCRIPTION

Figure 1:
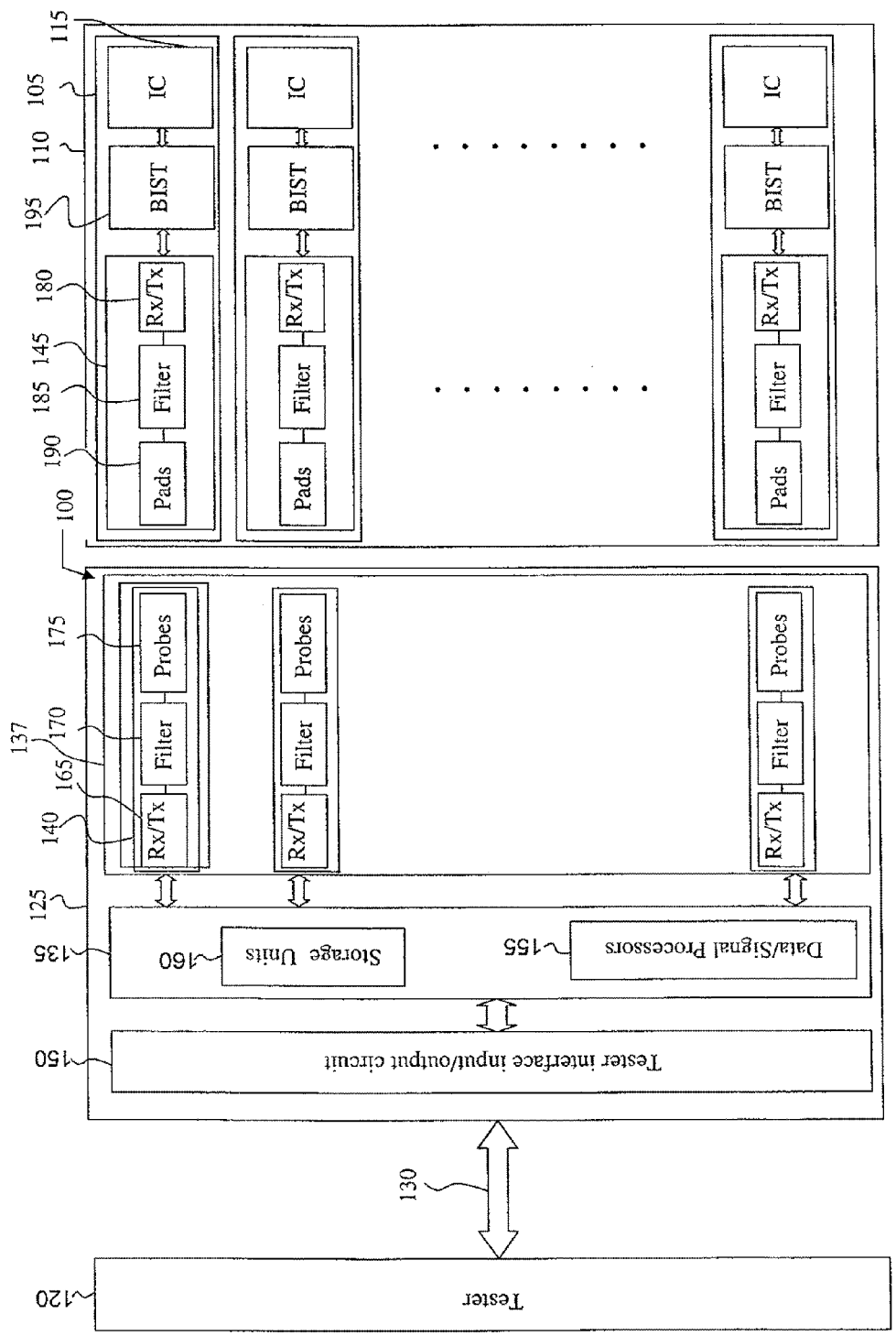
FIG. 1 schematically shows a block diagram of a test system according to a an embodiment of the present invention.

Throughout the following description, identical or similar elements in the drawings are denoted by same reference numerals.

Referring to FIG. 1, a block diagram of a test system 100 according to an embodiment of the present invention is schematically shown. The test system 100 is adapted to perform the wafer-level testing of a plurality (for example, hundreds) of IC dies 105 belonging to a semiconductor wafer 110, prior to the dicing thereof into individual chips.

The specific type of IC 115 integrated on the dies 105 is not limitative of the present invention; in particular, and merely by way of example, the ICs 115 may be or include memory devices, microprocessors or microcontrollers, Digital Signal Processors (DSPs), digital logic circuits, Application Specific Integrated Circuits (ASICs), Field Programmable Gate arrays (FPGAs), analog circuits, RF circuits, MEMS (Micro ElectroMechanical Systems).

For testing the ICs 115 on the dies 105 in order to assess their functionality, the test system 100 comprises a tester 120, which is an equipment adapted to manage test signals, and in particular to generate test stimuli to be fed to the ICs 115 integrated on the dies 105, and to process test response signals received from the ICs 115 under test; the tester 120 is coupled to a probe card 125, which is adapted to communicate with the tester 120 through wire line and/or wireless electrical signal distribution means 130 (which may be or include electrical cables, conductive lines or tracks, a wireless radio link or an optical link); in particular, the probe card 125 is adapted to exchange the test signals with the tester, and receives from the tester the power supply necessary for its operation; the probe card 125 is employed for interfacing the tester 120 with the IC 115 on each die 105 on the wafer 110.

The probe card 125 comprises a control circuit 135, adapted to manage the test signals exchanged with the tester 120, and a testing section 137 comprising a plurality of communication units 140, each of which is adapted to communicate with a corresponding communication unit 145 provided in each die 105 of the wafer under test. In other words, each of the communication units 140 of the testing section 137 of the probe card 125 is adapted to establish in use a one-to-one communication relationship with a corresponding communication unit 145 provided on a corresponding one of the dies 105 of the semiconductor wafer 110 to be tested. It is pointed out that, in some embodiments of the invention, the plurality of communication units 140 of the probe card 125 may include a number of units 140 equal to the number of dies 105 of the wafer 110 to be tested (in which case, all the dies of the wafer can in principle be tested in parallel); however, in alternative invention embodiments, the number of communication units 140 of the probe card 125 may be lower than the number of dies 105 of the wafer 110 (in which case, groups of dies of the wafer are tested in parallel, and, in order to test the full wafer, the probe card can be sequentially displaced by predetermined steps with respect to the wafer under test, or a communication unit 140 can test more than one die 105), or the number of communication units 140 of the probe card may be even greater than the number of dies 105 of the specific wafer under test (in which case, only a subset of the probe card communication units 140 are used for testing the whole wafer, or one die 105 can be tested by means of more than one communication unit 140).

The tester 120 and the control circuit 135 of the probe card 125 may communicate through a tester interface input/output circuit 150. The control circuit 135 comprises, for example, data/signal processors 155 which control the overall operation of the probe card 125, and which operates under the control of a software/firmware stored in local storage units 160.

Each communication unit 140 includes at least one transponder/transceiver 165 (that can comprise coding/decoding circuits), which is coupled to at least one filter unit 170. A Device Under Test (DUT) interface unit 175 is provided for each communication unit 140, for the coupling with a respective die of the wafer under test; more in detail, the DUT interface unit 175 comprises a plurality of probes (for example, of MEMS type, or cantilever probes or vertical probes) which are used for establishing a physical communication channel with the corresponding communication unit 145 provided on the die 105.

Similarly, each communication unit 145 on the die 105 includes at least one transponder/transceiver 180 (that, similarly to the transponder/transceiver 165, can comprise coding/decoding circuits), which is coupled to at least one further filter unit 185 and to a probe card interface unit 190 comprising a plurality of input/output contact pads, which are used for being contacted by the probes belonging to the corresponding DUT interface unit 175. A Built In Self Testing (BIST) circuitry 195 may be provided on the die 105, adapted to coupling the communication unit 145 with the core integrated circuit 115 and to perform the testing of the IC.

The transponder/transceiver 165, with the associated filter unit 170 and the DUT interface unit 175, and the transponder/transceiver 180, with the associated filter unit 185 and probe card interface unit 190, are adapted to establish a bi-directional communication link between the probe card 125 and a corresponding die 105 of the wafer under test 110.

During the testing, the generic transponder/transceiver 165 on the probe card 125 encodes the test stimuli received from the tester 120 and transmits them to the transponder/transceiver 180 on the respective die 105 of the wafer, using any suitable coding and modulation schemes/techniques. Examples of modulation schemes include Amplitude Modulation (AM), Frequency Modulation (FM), Pulse Code Modulation (PCM), Phase Modulation (PM) or any combination thereof. The specific coding and modulation schemes are not per-se limitative of the present invention.

Then, the transponder/transceiver 180 receives, demodulates and decodes the test stimuli, provides the demodulated and decoded test stimuli to the BIST circuitry 195, and the test stimuli are then used by the BIST circuitry 195 for testing the IC 115 integrated on the die 105. Test response signals are generated by the IC 115 in response to the performed test: the test response signals are then encoded, modulated and transmitted by the transponder/transceiver 180 to the probe card 125, where the transponder/transceiver 165 performs a demodulation and decoding of the received signals, and the test response signals are then sent to the tester 120, which processes them to assess the functionality of the IC 115 integrated on the die 105 under test.

In the example at issue, as better described in the following, the power supply necessary for the operation of the ICs 115 under test is supplied thereto by means of the probes belonging to each DUT interface unit 175.

In particular, according to an embodiment of the present invention, in order to reduce the number of input/output contact pads used for testing the ICs on the dies 105 of semiconductor wafer 110, the test signals are exchanged through a reduced number of physical communication channels (each comprising the DUT interface 175 and the probe card interface 190). For this purpose, a signal mixing, based on a suitable coding and modulation scheme of the test signals, for example, a frequency division multiplexing scheme, is used. As better shown in FIG. 2, the transponder/transceiver 165, for example, encodes and modulates the test stimuli received from the tester 120 and transmits them with a first modulation frequency f1 (for example, ranging from 30 Hz to 300 GHZ, e.g. 150 MHz), whereas the test response signals generated by the IC 115 under test are encoded, modulated and transmitted by the transponder/transceiver 180 to the probe card 125 with a second modulation frequency f2 (for example, ranging from 30 Hz to 300 GHZ, e.g. 100 MHz) which is different from the first frequency f1. In other words, according to an embodiment of the present invention, by differentiating the radio frequencies used for transmitting the test stimuli and the test response signals, it is possible to use only one physical communication channel for the exchange of the test signals between the probe card 125 and the wafer 110.

Figure 2:
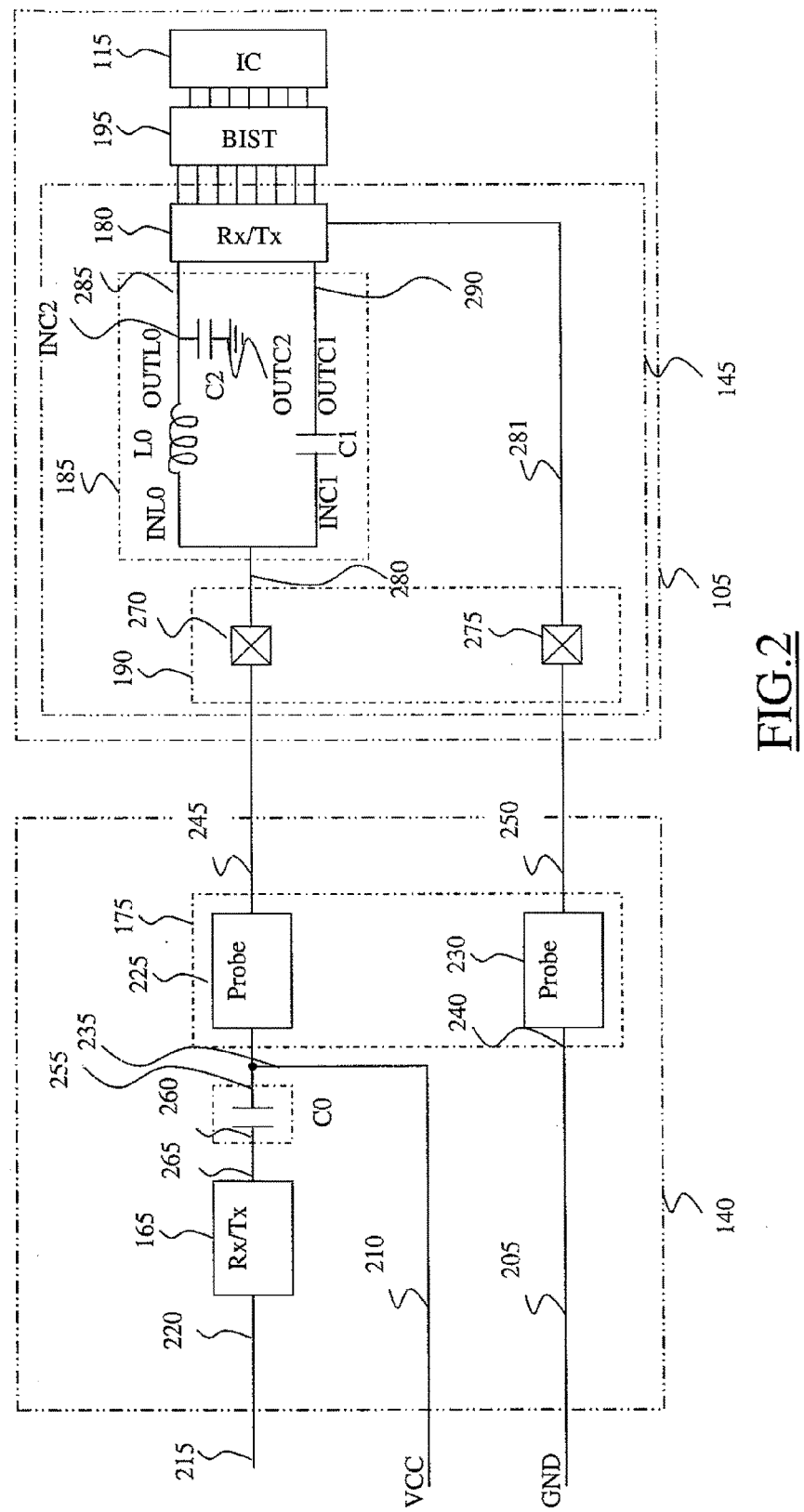
FIG. 2 schematically shows a portion of the test system of FIG. 1 according to an embodiment of the present invention.

Referring to FIG. 2, an exemplary implementation of the unit 140 and the communication unit 145 is shown.

The unit 140 receives from the tester interface input/output circuit 150 (not shown in FIG. 2) a reference voltage GND through a reference voltage distribution line 205, a supply voltage VCC through a supply voltage distribution line 210, and the test signals through a test signals distribution line 215. The test signals distribution line 215 is connected to an input terminal 220 of the transponder/transceiver 165.

The supply voltage distribution line 210 and the reference voltage distribution line 205 respectively feed the supply voltage VCC and the reference voltage GND to a first probe 225 and a second probe 230 of the DUT interface unit 175. For this purpose, the first probe 225 has a first input terminal 235, which is connected to the supply voltage distribution line 210. Similarly, the second probe 230 has a second input terminal 240, which is connected to the reference voltage distribution line 205. Moreover, the first probe 225 and the second probe 230 have respectively a first output terminal or tip 245 and a second output terminal or tip 250, which are adapted to contact the corresponding die 105 under test, and particularly the respective probe card interface unit 190 on the die 105.

In the example at issue, the filter unit 170 comprises a first capacitor C0 having a first terminal 255 connected to the first probe 225 and a second terminal 260 connected to an output terminal 265 of the transponder 165.

The probe card interface unit 190 which is provided in the communication unit 145 of the die 105 includes a first input/output contact pad 270 and a second input/output contact pad 275 which are adapted to be contacted during the test of the die 105 by the tips 245 and 250 of the first probe 225 and the second probe 230, respectively. The input/output contact pad 270 is connected to an input terminal 280 of the filter unit 185, whereas the contact pad 275 is connected to an input terminal 281 of the transponder/transceiver 180 (so that the pad 275 provides the reference voltage GND to the transponder 180).

In the example at issue, the filter unit 185 comprises second and third capacitors C1 and C2 and an inductor L0. In more detail, the inductor L0 has a first terminal INL0, which is connected to the filter unit input terminal 280, and a second terminal OUTL0, which is connected to a first terminal INC2 of the capacitor C2. A second terminal OUTC2 of the capacitor C2 is kept to the reference voltage GND. Moreover, the first terminal INC2 of the capacitor C2 is connected to a first output terminal 285 of the filter unit 185.

In turn, the capacitor C1 has a first terminal INC1, which is connected to the input terminal 280, and a second terminal OUTC1, which is connected to a second output terminal 290 of the filter unit 185. The first output terminal 285 and the second output terminal 290 are connected to the transponder/transceiver 180.

During the testing, the reference voltage GND and the supply voltage VCC (which are essentially constant, time-invariable voltages, or vary at very low frequencies) are fed to the communication unit 145. In particular, the second probe 230, by directly contacting the input/output contact pad 275, provides the reference voltage GND to the transponder/transceiver 180. Similarly, the supply voltage VCC is fed to the communication unit 145 by means of the first probe 225, which is adapted to directly contact the input/output contact pad 270. The supply voltage VCC does not affect the voltage reached by the output terminal 265, since the first capacitor C0 has a high impedance (ideally, it is an open circuit) at low frequencies. Through the probe 225 and the contact pad 270, the IC on the die under test 105 receives a signal being the superposition of an essentially DC (Direct Current) signal, corresponding to the supply voltage VCC, and of the test stimuli, encoded and modulated at the first frequency f1. This combined signal is fed to the filter 185, which separates the DC component from the signal component at the first frequency f1. The DC component, corresponding to the supply voltage VCC, is made available at the first output terminal 285 of the filter 185, and is fed to the transponder/transceiver 180, since the inductor L0 has a low impedance (ideally, it behaves as a short circuit in DC). The second capacitor C2 does not affect the voltage reached by the first output terminal 285 since it has a high impedance (ideally, it behaves as an open circuit in DC). In DC, also the capacitor C1 has a high impedance (ideally, it behaves as an open circuit), thus the DC signal component does not reach the second output terminal 290 of the filter 185.

The signal component at the first radio frequency f1 is made available at the second output terminal 290 of the filter 185, and is sent to the transponder/transceiver 180, since the capacitor C1, at the first frequency f1, has a low impedance (ideally, it behaves as a short circuit). The signal component at the first frequency f1 does not reach the first output terminal 285 of the filter 185, since at the first frequency f1 the capacitor C2 has a low impedance (ideally, it behaves as a short circuit), and the inductor L0 has a high impendence (ideally, it behaves as an open circuit); thus, the signal carrying the test stimuli do not affect the voltage at the first output terminal 285 of the filter unit 185. In this way, the essentially DC component (carrying the voltage supply) and the component at the first frequency f1 (carrying the test stimuli) of the combined signal transmitted to the die 105 through the probe 245 are effectively separated by the filter 185.

The transponder/transceiver 180 receives, demodulates and decodes the test stimuli, and the test stimuli are then supplied to the BIST circuitry 195 for testing the IC 115 integrated on the die 105; test response signals are generated in response to the test performed by the IC 115 based on the received test stimuli: the test response signals are encoded, modulated and transmitted with the second radio frequency f2 by the transponder/transceiver 180 to the probe card 125 over the same communication channel formed by the contact pad 270 and the probe 225. The transponder/transceiver 165 performs a demodulation and decoding of the received, modulated and coded test response signals, and the demodulated and decoded test response signals are then sent (in a way similar to that described above) to the tester 120, which processes them to assess the functionality of the IC 115 integrated on the die 105 under test.

In this way, in the exemplary invention embodiment being described, only two input/output contact pads need to be contacted by probes for testing the IC on the die 105, since the test stimuli and the test response signals are exchanged with different operative radio frequencies exploiting the same physical communication channel, i.e. the same probe.

Figure 3:
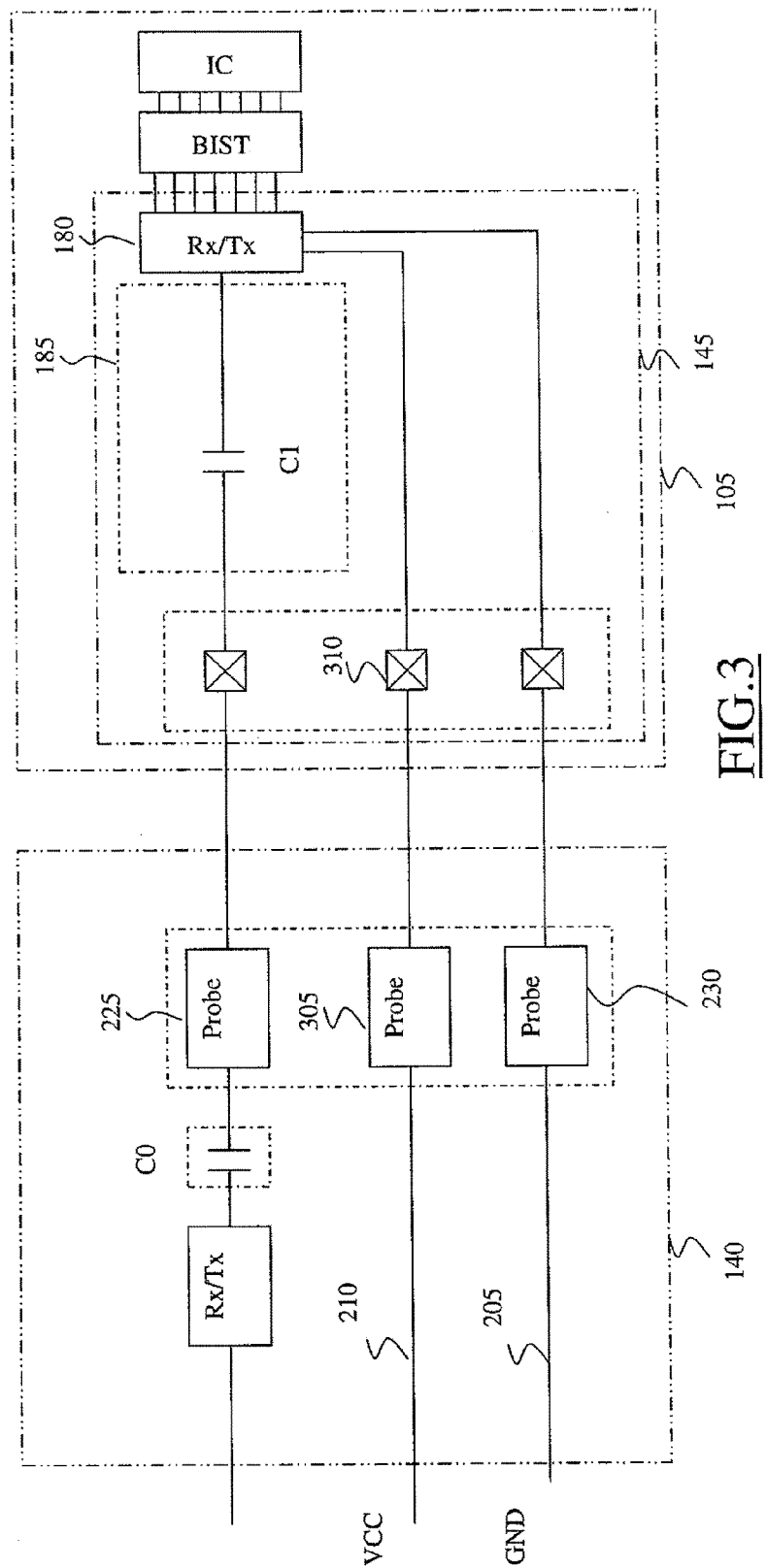
FIG. 3 schematically shows a portion of the test system of FIG. 1 according to an embodiment of the present invention.

In FIG. 3 an exemplary implementation of the unit 140 and the communication unit 145 according to another embodiment of the present invention is shown. In this case, three physical communication channels, comprising three probes and corresponding contact pads on the die under test are used for communicating with the generic IC 115 under test. The supply voltage distribution line 210 on the probe card is coupled to a third probe 305 (an additional probe compared to the two probes 225 and 230 of the previous embodiment) which is adapted for contacting a corresponding input/output contact pad 310 of the probe card interface unit 190. In this case, the supply voltage VCC reaches directly the transponder/transceiver 180. The filter unit 185 does not have to perform a separation of signal components at DC and at the first frequency, thus it can be simplified. In particular, the filter unit 185 may eventually comprise only the capacitor C1 (C2 can be omitted); alternatively, both the capacitors C0 and C1 may be omitted. However, the presence of optimized filters 170, 185 becomes particularly useful when the frequencies used for modulating the test signals are so high that the physical communication channels need to be characterized by means of a distributed-parameters electrical model (e.g. transmission lines).

Figure 4:
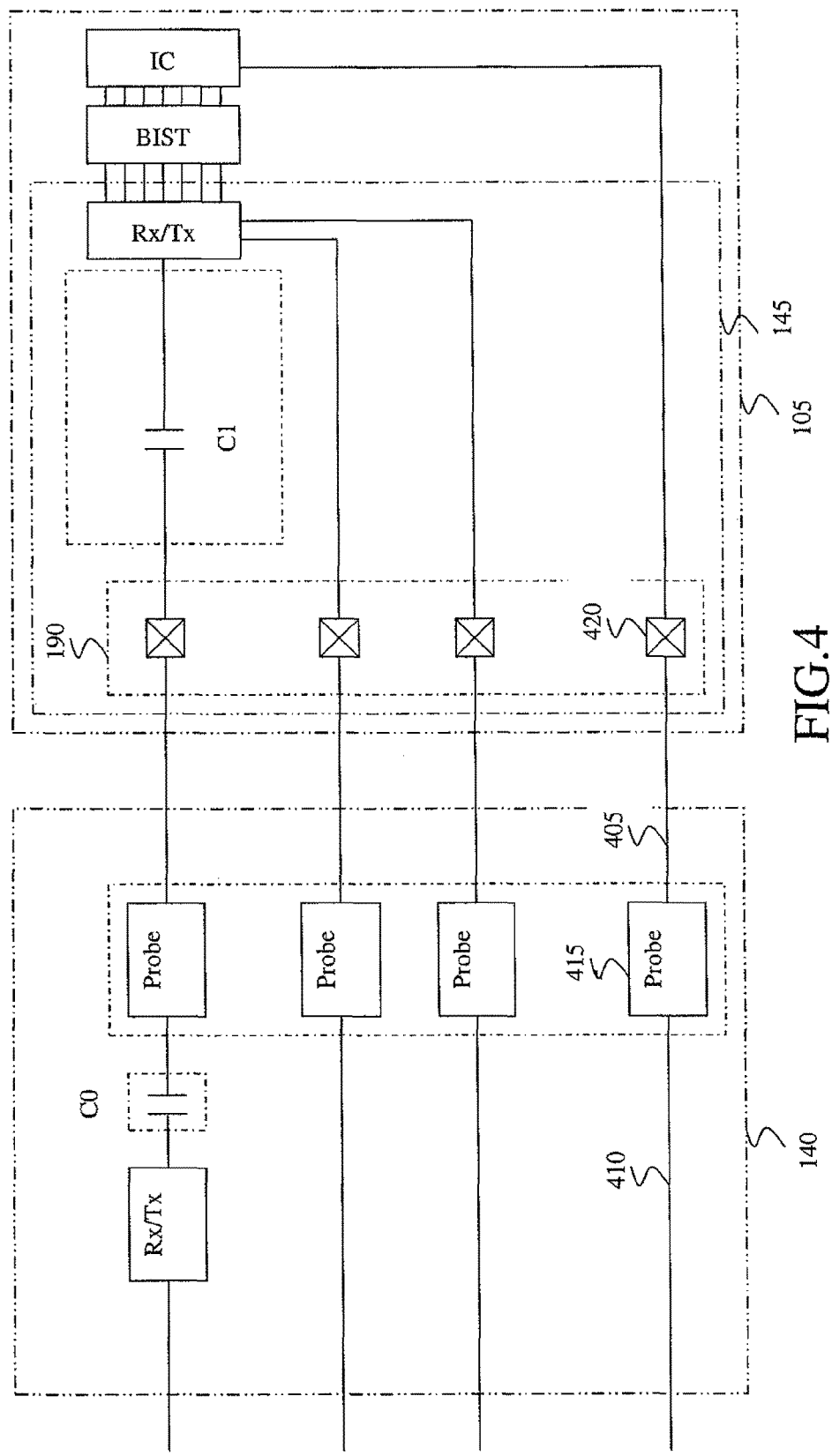
FIG. 4 schematically shows a portion of the test system of FIG. 1 according to another embodiment of the present invention.

In FIG. 4, an exemplary implementation of the unit 140 and the communication unit 145 according to still another embodiment of the present invention is shown. In this case, compared to the embodiment of FIG. 3, a still additional physical communication channel 405 is provided, comprising a distribution line 410 on the probe card, which is connected to a fourth probe 415. The probe 415 is adapted to contact a corresponding input/output contact pad 420 of the probe card interface unit 190. Through the additional channel 405, additional test signals can be exchanged; for example, the additional channel 405 may be exploited for testing the integrated circuit 105 without the use of the BIST circuit 195. For example, the additional channel can be employed for testing power circuits or RF circuits or analog circuits or for Automatic Tester Equipment (ATE) essential resources use in order to measure particular parameters or characteristics.

In the following, exemplary embodiments of the probe card are presented, adapted to be used in the context of the present invention.

Figure 5A:
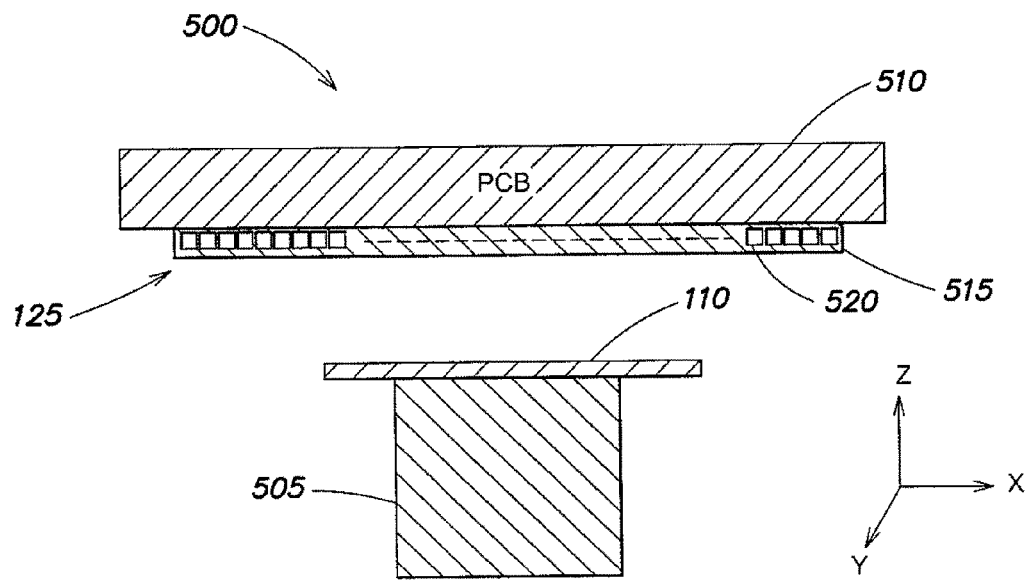
FIGS. 5A and 5B schematically shows a cross-sectional view of a probe card according to an embodiment of the present invention, adapted to be used in the test system of FIG. 1.
Figure 5B:
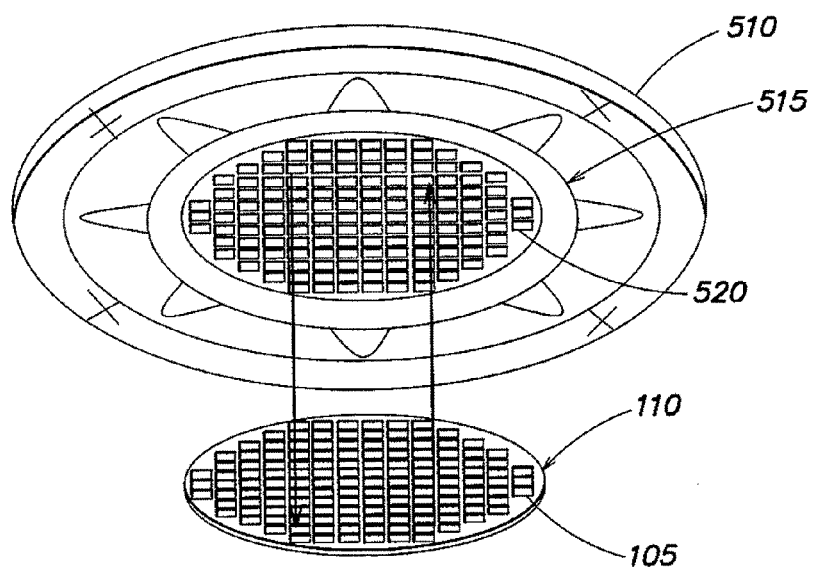

Referring to FIGS. 5A and 5B, a cross-sectional view of a test equipment 500 is schematically shown, in which an exemplary structure and the positioning of the probe card 125 according to an embodiment of the present invention and the semiconductor wafer 110 to be tested is visible.

The semiconductor wafer 110 to be tested is placed on a chuck 505, which is capable of movement in the three orthogonal directions "x", "y" and "z" schematically indicated in the drawing. The chuck 505 may also be rotated and tilted, and it may be further capable of other movements, so that once the semiconductor wafer 110 is placed on the chuck 505, the latter is moved in order to bring the dies 105 of the wafer 110 to be tested close to the probe card 125, for enabling the communication therewith.

In the example at issue, the probe card 125, in one of its embodiments, includes a PCB 510 forming a support for a pseudo wafer 515, comprising a plurality of dies, each one forming an elementary probe unit 520.

The PCB 510 comprises all the circuitry, which is employed for the communication between the tester (not shown in figures) and the semiconductor wafer 110 under test. For example, the PCB 510 comprises the tester interface input/output unit 150, the data/signal processors 155, and the storage units 160.

A top view of the probe card 125 (including the pseudo wafer 515) and the semiconductor wafer 110 is also schematically shown in the drawing.

As visible, the elementary units 520 are arranged in the pseudo silicon wafer 515 in order to form a two-dimensional arrangement, which corresponds, to the arrangement of dies on the semiconductor wafer 110 under test. In particular, the pseudo wafer 515 comprises an array of the elementary units 520 which reproduce a shape of the wafer to be tested. In an embodiment of the present invention, each of the elementary unit 520 of the pseudo wafer 515 belonging to the probe card 125 is adapted to establish a one-to-one communication relationship with a corresponding die of the semiconductor wafer 110 to be tested, a number of MEMS probes adapted to contact the pads of an IC. It is to be appreciated that probes of different type or arranged with a different architecture can be used (e.g. vertical probes, or pogo pins).

In particular, as better described in the following, each elementary unit 520 may be formed starting from a silicon die, individually diced and finally assembled with the other elementary units 520 in order to form the pseudo wafer 515 having a shape corresponding to the semiconductor wafer 110 to be tested.

Referring to FIGS. 6A and 6B, a portion of the probe card 125 according to an embodiment of the present invention is shown. In particular, FIGS. 6A and 6B show an elementary unit 520 according to an embodiment of the present invention. The elementary unit 520 includes a silicon die 605 which is connected, e.g. by chip on board/flip-chip techniques, to the PCB 510. In particular, bumps 610 are provided in order to connect a top surface 615 of the silicon die 605 to the PCB 510. A complex conductive path (not completely shown in the figure) that can include one or more conductive through vias 620, particularly Through Silicon Vias (TSVs), is provided crossing the silicon die 605 in order to connect the top surface 615 to a bottom surface 625 of the silicon die 605. Mechanical elements forming probes 630 (one of which is shown in FIG. 6B), particularly of MEMS type, are connected to the bottom surface 625 of the silicon die 605. In particular, the through vias 620 are adapted to electrically connect the MEMS probes 630 to the top surface 615 of the silicon die 605 and thus to the PCB 510, through a conductive path (only partially shown in the drawing).

The transponders/transceivers 165 are integrated in the silicon die 605.

In particular, for electrically contacting the input/output contact pads of the die to be tested and exchanging the test signals between the input/output contact pads and the tester (not shown in figures), the PCB 510 has corresponding conductive paths 635 which electrically couple the tester to the silicon die 605 and thus to the probes 630. In particular, for testing the ICs of the wafer dies in order to assess their functionality, the tester is adapted to generate test stimuli to be fed to the ICs integrated on the dies belonging to the semiconductor wafer 110; the tester is coupled by means of the PCB 510 to the elementary units 520, each one of which is adapted to be fed by the tester through the conductive paths 635 with the test stimuli, and the power supply necessary for its operation.

In other words, the MEMS probes 630, the through vias 620, the bumps 610 and the conductive paths 635, are adapted to establish a bidirectional link between the tester and each die of the semiconductor wafer 110 under test (or groups of dies).

In an embodiment of the present invention, the probe card 125 receives the test stimuli from the tester, encodes, modulates and transmits them with the first radio frequency f1 to the ICs on the dies to be tested using the MEMS probes 630. The test stimuli, after having been demodulated and decoded, are then used to test the IC integrated on the die belonging to the semiconductor wafer 110; test response signals are generated by the ICs in response to the test stimuli. The test response signals are encoded, modulated and transmitted at the second radio frequency f2 to the probe card 125, and then, after having been demodulated and decoded, they are sent to the tester, which processes them to assess the functionality of the IC integrated on the die under test.

Referring to FIGS. 7A and 7B, an elementary unit 520 according to another embodiment of the present invention is shown. Similarly to the preceding case, each elementary unit 520 comprises the silicon die 605, bumps 610, through vias 620 and the MEMS probe 630. In this case the transponder/transceiver 165 is integrated in an auxiliary die 710 which is connected, e.g. by chip on board/flip-chip techniques, to the PCB 510. In particular, bumps 715 are provided in order to connect a bottom surface 720 of the auxiliary die 710 to the PCB 510 and/or for the connection to the tester.

Moreover, for electrically contacting the input/output contact pads of the die to be tested and exchanging the test signals between the input/output contact pads and the tester (not shown in figures), the PCB 510 has corresponding conductive paths 725 which electrically couple the bumps 610 to the bumps 715 so as to couple the tester to the silicon die 605 and thus to the probes 630.

Further conductive paths 730 are provided for electrically coupling the transponder 165 to the circuits belonging to the PCB 510.

Figure 8A:
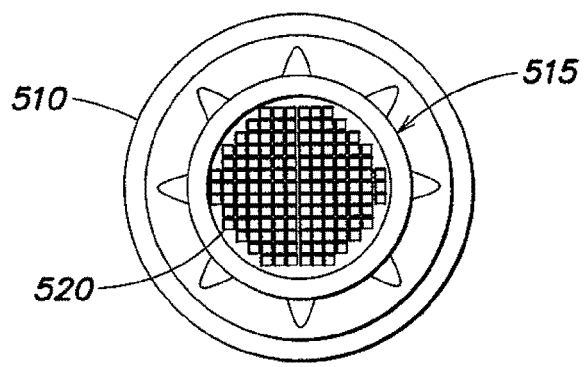
FIGS. 8A and 8B partially shows a cross-sectional view of a probe card according to still another embodiment of the present invention.
Figure 8B:
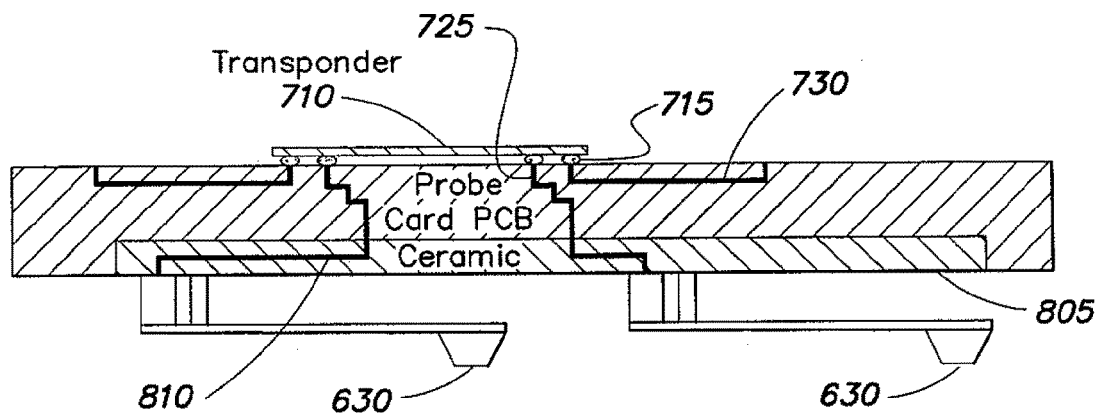

Referring to FIGS. 8A and 8B, an elementary unit 520 according to still another embodiment of the present invention is shown.

With respect to the preceding embodiment, the silicon die 605 is substituted by a ceramic layer 805 to which the probes 630 are connected. In particular, the ceramic layer 805 is employed for forming a support for the probes 630. Conductive paths 810 are provided within the ceramic layer 805 for electrically coupling each probe 630 to the corresponding conductive path 725.

The present invention allows testing the ICs integrated on the dies of the semiconductor wafer 110 by using a reduced, possibly very low number of contact pads and probes, thereby improving the performance and the reliability of the testing, and reducing the costs of the test equipment.

Although in the preceding description reference has been made to a test system wherein each communication unit 145 in the dies to be tested includes only one transponder/transceiver, two or more transponders/transceivers can be provided in each communication unit 145. In such a way, according to an embodiment of the present invention, each transponder/transceiver may be used not only for performing the testing, but also for other applications. For example, the transponders/transceiver integrated in each communication unit may be used for chip-to-chip communication in multichip systems (such as Systems In Package SIPs), or, in case the dies integrate Systems-on-Chip, made up of several different functional units (e.g., CPU, memory, input/output buffers), for the communication between the different units within the IC. In particular, the communication unit 145 provided in each die 110 may be exploited, when the dies containing different ICs are packaged in a single package to form an SIP, for the communication between the different ICs of the SIP, thereby reducing the number of signal lines necessary for their interconnection. Similarly, in the case of an SoC, the communication between the different functional units thereof may take advantage of the presence of the communication unit 145, thereby the number of signal lines to be formed on the IC may be greatly reduced.

According to an embodiment of the present invention, multiple test stimuli can be mixed and sent by the probe card to the generic IC under test over the same communication channel, i.e. through one probe, by exploiting different frequencies. For example, considering the case of ICs formed of or including semiconductor memories, commands, address signals and input data can be sent to the memory IC through the same probe Conventionally, address signals are supplied to the IC using several probes, contacting the multiplicity of address contact pads of the memory, and input data are supplied to the IC using several other probes, contacting the multiplicity of data contact pads of the memory.

According to a further embodiment of the present invention, using the same probe and contacting one pad only on the IC, the commands can be sent coding and modulating them over a signal carrier at one frequency, the address signals can be sent coding and modulating them over a signal carrier at another frequency, and the input data can be sent coding and modulating them over a signal carrier at still another frequency. Properly designed filter units in the probe card and in the ICs may be used to separate the different signal components.

According to a still further embodiment of the present invention, a first communication channel, i.e. one probe, can be used for communications from the probe card to the IC under test, to send to the IC under test multiple test stimuli, and a second communication channel, i.e. another probe, can be used for communications from the IC under test back to the probe card, to send the multiple test response signals (for example, the output data of a memory device, generally comprised of eight or sixteen bits, may be coded and modulated and sent through one probe only). Multiple test stimuli can be mixed and sent over the first communication channel, and, similarly, multiple test response signals can be mixed and sent over the second communication channel, for example, adopting a frequency-division multiplexing scheme; the different frequencies used in the second communication channel for sending the test response signals may be the same as those used in the first communication channel for sending the test stimuli, since the two channels are separated.

The concepts of the present invention can be advantageously applied to even more complex IC structures, as in a three dimensional (3D) IC structure. As it is well known to those skilled in the art, a 3D IC structure is formed by a plurality of vertically stacked device layers, each one including at least one respective semiconductor chip. The semiconductor chip of a generic device layer may be physically linked to the semiconductor chips of the adjacent device layers in the stack by means of a wafer bonding process; alternatively, starting from a bottom semiconductor substrate, the semiconductor chips of the various device layers may be formed by means of an epitaxial growth process. With a 3D IC structure it is possible to integrate a relatively complex system without having to waste an excessive silicon area. For example, the bottom device layer of a 3D IC structure may be directed to the integration of processing and logic circuits, an intermediate device layer may be directed to the integration of memory circuits, and the top device layer may be directed to the integration of input/output circuits and converters. A generic device layer is able to exchange signals and reference and supply voltages with the adjacent device layers in the stack by means of respective through vias, and particularly TSVs, vertically crossing the semiconductor chip of the device layer from the top surface to the bottom surface thereof. With an arrangement of such type, a 3D IC structure is able to receive and provide signals and reference and supply voltages from/to the outside through input/output circuits and contact pads which are integrated, for example, on the top surface of the top device layer only. Indeed, the lower device layers cannot be directly accessed, lacking of free surfaces provided with contact pads that can be reached from the outside. This drawback negatively affects the test operations to be performed on a 3D IC structure, since a probe card cannot directly interface the tester with the integrated circuits corresponding to the lower device layers. The only way the test signals provided by the probe card are able to reach the integrated circuits of a generic lower device level is through physical communication channels that cross the semiconductor chips of the higher device levels. As a consequence, since all the test signals needed for assessing the functionality of the whole 3D IC structure have to pass through the top device level, the number of probes of the probe card that have to be coupled to contact pads on the top surface of said device level during the test operations becomes really high. For the reasons already described, a probe card requiring a very high number of probes is not efficient, and is very expensive.

According to an embodiment of the present invention, the solution of reducing the number of probes necessary to perform the test operations by employing a mixing of multiple test stimuli and/or test response signals over the same physical communication channel can be advantageously exploited for overcoming the abovementioned problems.

Figure 9A:
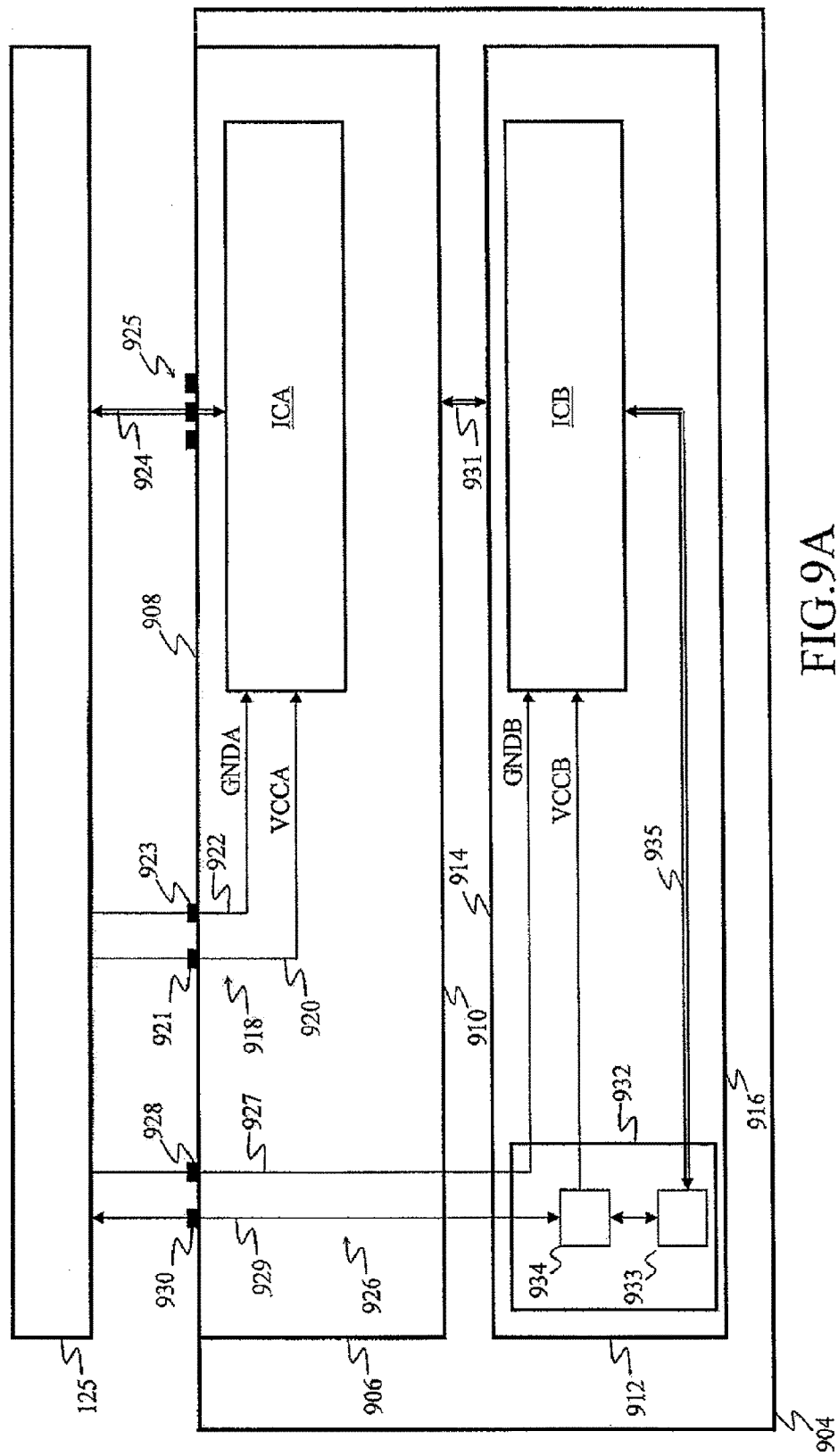
FIGS. 9A-9D schematically show, in terms of very simplified functional blocks, a 3D IC structure according to various embodiments of the present invention.

Referring to FIG. 9A an exemplary 3D IC structure 904 according to an embodiment of the present invention is shown in terms of very simplified functional blocks. For the sake of simplicity, the exemplary 3D IC structure 904 is partitioned in two device levels only referred to as top device level and bottom device level, but the concepts of the present invention can be applied to any number of device levels.

The top device level includes a semiconductor chip 906 having a top main surface 908 and a bottom main surface 910; the semiconductor chip 906 integrates a first integrated circuit, globally identified with the reference ICA. Similarly, the bottom device level includes a semiconductor chip 912 having a top main surface 914 and a bottom main surface 916; the semiconductor chip 912 integrates a second integrated circuit, identified with the reference ICB.

The semiconductor chips 906 and 912 forming the 3D IC structure 904 are arranged in a vertical stack, with the bottom main surface 910 of the semiconductor chip 906 that overtops the top main surface 914 of the semiconductor chip 912.

To allow the integrated circuit ICA to be electrically supplied from the outside of the 3D IC structure 904 during its operation, the semiconductor chip 906 is provided with a dedicated first supply bus 918. In more detail, the first supply bus 918 includes a supply voltage line 920 coupling the integrated circuit ICA with a respective contact pad 921 on the top main surface 908; the first supply bus 918 further includes a reference voltage line 922 coupling the integrated circuit ICA with another respective contact pad 923 on the top main surface 908. In this way, the integrated circuit ICA can be fed from the outside of the 3D IC structure 904 with a supply voltage VCCA (through the contact pad 921 and the supply voltage line 920) and a reference voltage GNDA (through the contact pad 923 and the reference voltage line 922).

Similarly, in order to exchange input/output signals (such as command, data and address signals) with the outside of the 3D IC structure 904, a first operative bus 924 couples the integrated circuit ICA with a set of respective contact pads on the top main surface 908, globally indicated in the figure with the reference 925.

For electrically supplying the integrated circuit ICB, a second supply bus 926 is provided, which vertically crosses the semiconductor chip 906 from the top surface 908 to the bottom surface 910 thereof (e.g., by means of respective TSVs) for reaching the top surface 914 of the semiconductor chip 912, and then the integrated circuit ICB.

In more detail, the second supply bus 926 includes a reference voltage line 927 coupling the integrated circuit ICB with a respective contact pad 928 on the top main surface 908 of the semiconductor chip 906; the second supply bus 926 further includes a supply voltage line 929 coupling the integrated circuit ICB with a further respective contact pad 930 on the top main surface 908 of the semiconductor chip 906. The integrated circuit ICB can be fed from the outside of the 3D IC structure 904 with a reference voltage GNDB (through the contact pad 928 and the reference voltage line 927) and a supply voltage VCCB (through the contact pad 930 and the supply voltage line 929).

In order to exchange command, data and address signals with the outside of the 3D IC structure 904, the integrated circuit ICB is coupled with the semiconductor chip 906 through a second operative bus 931. By means of respective TSVs, the second operative bus 931 reaches the integrated circuit ICA, in such a way that the signals carried by said operative bus 931 may be provided/received to/from the outside of the 3D IC structure 904 exploiting the first operative bus 924 and the respective contact pads 925 on the top main surface 908. In addition or in alternative, the second operative bus 931 may be also directly connected with the first operative bus 924.

In order to test its functionality, the 3D IC structure 904 is positioned close to the probe card 125, for bringing the contact pads located on the top surface 908 of the semiconductor chip 906 in contact with the probes of the probe card 125, in such a way to enable the communication between the tester 120 and the integrated circuit ICA of the semiconductor chip 906. Particularly, during the test operations, the integrated circuit ICA is supplied by means of probes of the probe card 125, which physically contact the contact pads 921 and 923 for providing the supply voltage VCCA and the reference voltage GNDA. Moreover, the test signals generated during the test operations are exchanged between the tester 120 and the integrated circuit ICA by means of further probes of the probe card 125, which physically contact the contact pads 925.

Similarly, during the test operations, the integrated circuit ICB is supplied by means of probes of the probe card 125 that physically contact the contact pads 928 and 930 for providing the supply voltage VCCB and the reference voltage GNDB.

During the testing, according to an embodiment of the present invention, the test stimuli generated by the tester 120 to be provided to the integrated circuit ICB and the test response signals generated by the latter circuit in response to the received test stimuli are exchanged between the probe card 125 and the integrated circuit ICB by means of the second supply bus 926, and particularly by encoding and transmitting them over at least one among the lines forming the second supply bus 926.

For this purpose, the semiconductor chip 912 is provided with a communication unit 932 of the same type of the communication unit 145 previously described. The communication unit 932 comprises at least one transponder/transceiver 933 (comprising coding/decoding circuits) coupled with at least one filter unit 934. Particularly, according to an embodiment of the present invention, the filter unit 934 has an input connected to the supply voltage line 929, a first output connected to the integrated circuit ICB, and a second output connected to an input of the transponder/transceiver 933. The transponder/transceiver 933 has an output coupled with the integrated circuit ICB by means of a third operative bus 935.

In the same way as for the previous embodiments, the probe card 125 encodes the test stimuli generated by the tester 120 and transmits them to the communication unit 932 by means of any suitable coding and modulation scheme using a first modulation frequency fm1 (for example, ranging from 30 Hz to 300 GHZ). Particularly, the probe card 125 superimposes the encoded and modulated test stimuli to the supply voltage VCCB (which is essentially constant) over the supply voltage line 929, providing it to the filter unit 934. The filter unit 934 separates the DC component, which corresponds to the supply voltage VCCB, from the signal component at the first modulation frequency fm1, which corresponds to the encoded and modulated test stimuli. While the DC component is directly provided to the integrated circuit ICB for the electric supply thereof, the signal component corresponding to the encoded and modulated test stimuli is demodulated and decoded by the transponder/transceiver 933, which accordingly retrieves the test stimuli generated by the tester 120 and provides it to the integrated circuit ICB by means of the third operative bus 935. The test response signals generated by the integrated circuit ICB in response to the performed test are then encoded, modulated and transmitted by the transponder/transceiver 933 to the probe card 125 over the supply voltage line 929, using a second modulation frequency fm2 different from the first modulation frequency.

In the same way as for the previous embodiments, a BIST circuitry may be provided in the semiconductor chip 912, adapted to couple the communication unit 932 with the integrated circuit ICB and to perform the testing thereof (similar considerations apply to the testing of the integrated circuit ICA).

Thus, with embodiments of the present invention, it is possible to drastically lower the number of probes necessary to perform the testing of the integrated circuits of a 3D IC structure, overcoming all the above-mentioned drawbacks.

Figure 9B:
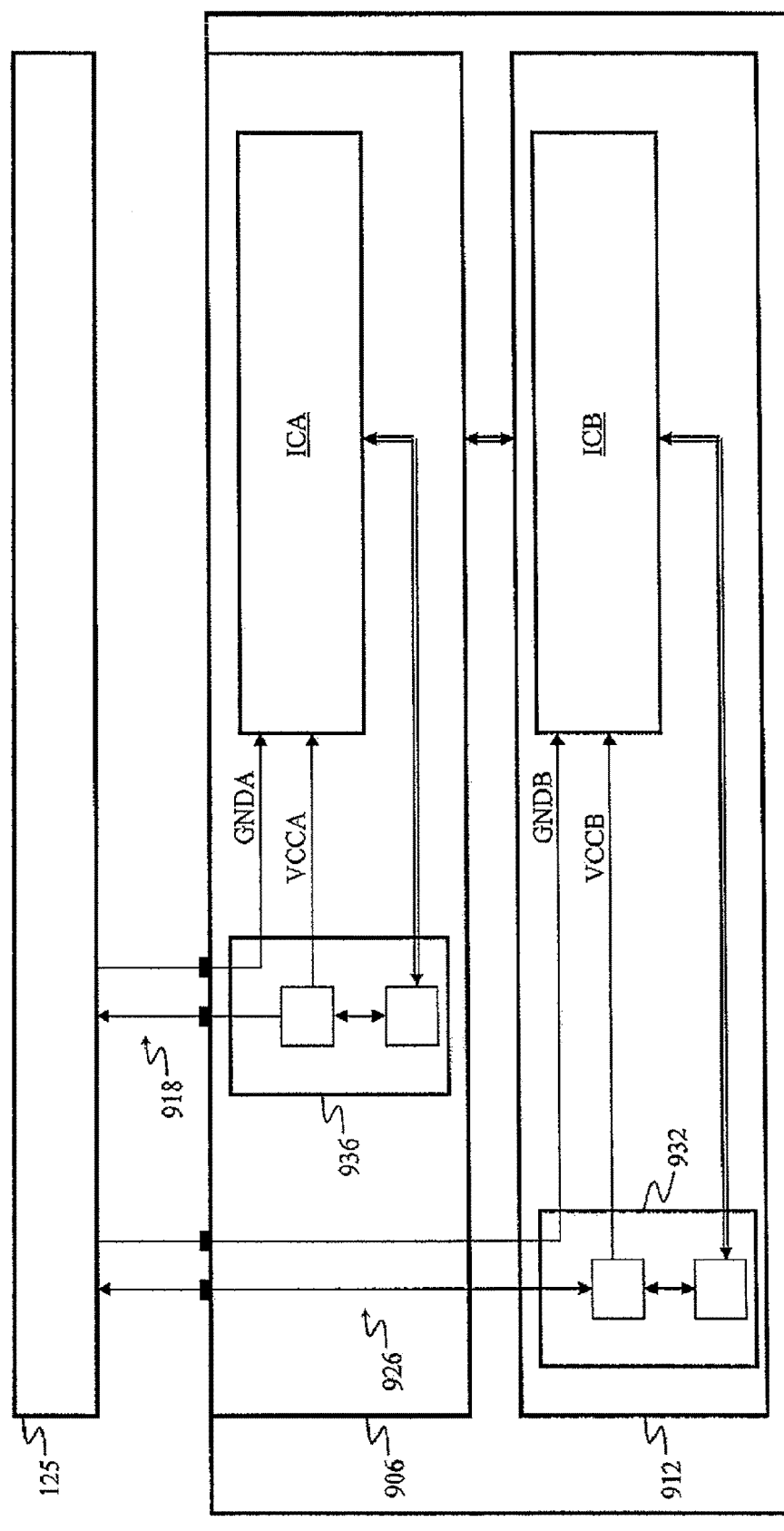

According to a further embodiment of the present invention illustrated in FIG. 9B, also the semiconductor chip 906 is provided with a communication unit 936 coupled with the supply bus 918 in the same way as the communication unit 932. As a consequence, the probe card 125 may send test stimuli to the integrated circuit ICA and receive test response signal therefrom without having to physically access, with the probes, dedicated contact pads on the top surface of the semiconductor chip 906. In this way, the number of probes required for performing the test operations are further reduced.

Figure 9C:
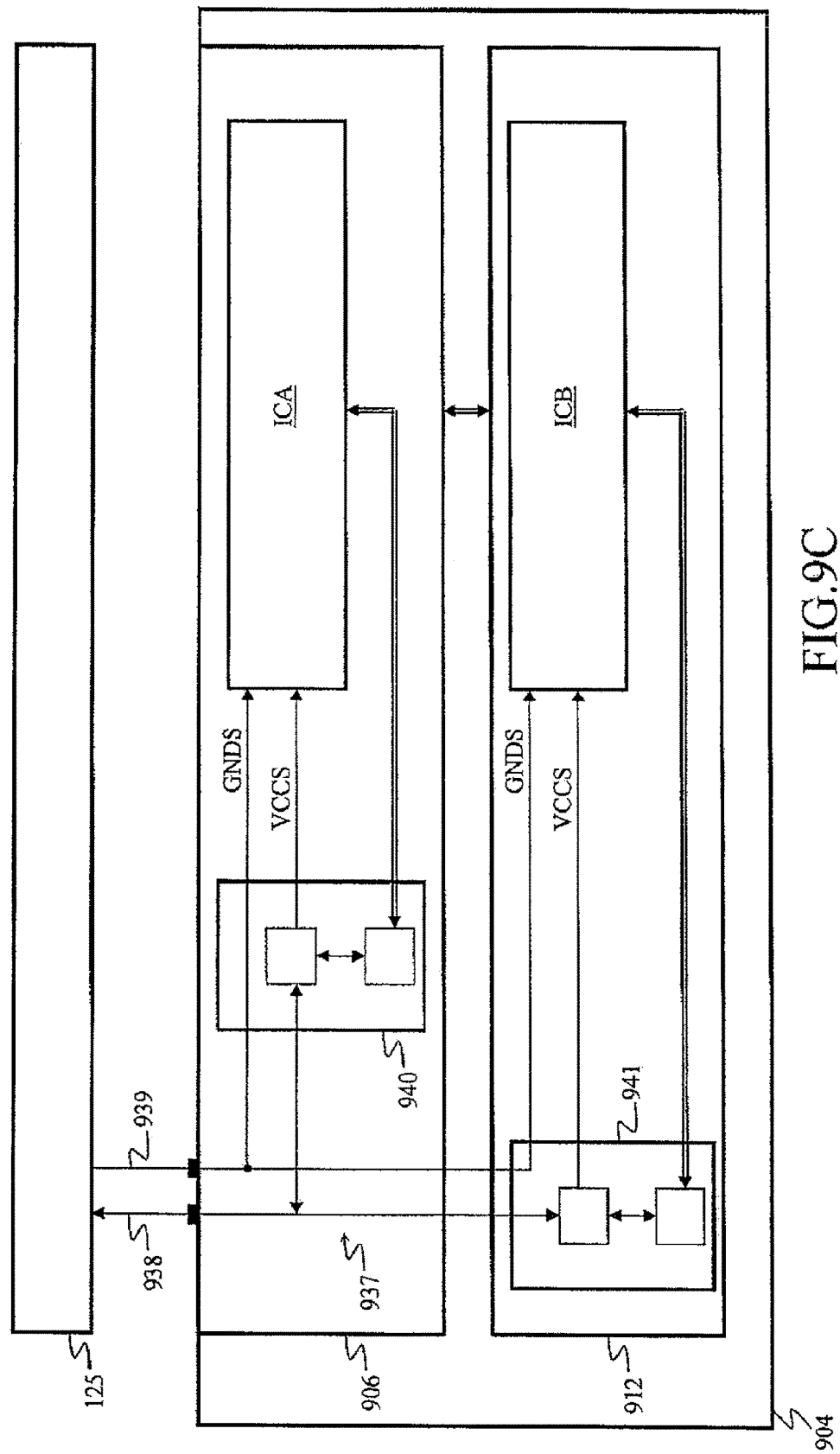

According to a still further embodiment of the present invention illustrated in FIG. 9C, the integrated circuits ICA and ICB of the 3D IC structure 904 share the same supply bus 937. The supply bus 937 comprises a supply voltage line 938 adapted to provide the same supply voltage VCCS and a reference voltage line 939 adapted to provide the same reference voltage GNDS to both the integrated circuits ICA and ICB.

According to this embodiment of the present invention, the test stimuli generated by the tester 120 to be provided to the integrated circuits ICA, ICB and the test response signals generated by the latter circuits in response to the received test stimuli are exchanged between the probe card 125 and the integrated circuits by means of the supply bus 937, and particularly by encoding and transmitting them over at least one among the lines forming the supply bus 937. Particularly, the test stimuli directed to the integrated circuit ICA are transmitted over the supply voltage line 938 using a first modulation frequency, while the test stimuli directed to the integrated circuit ICB are transmitted over the same supply voltage line 938 using a second modulation frequency different from the first one. In this case, both the semiconductor chips 906 and 912 are provided with a respective communication unit 940, 941 coupled with the supply voltage line 938. Particularly, the communication unit 940 integrated in the semiconductor chip 906 is adapted to collect the signal component at the first modulation frequency from the supply voltage line 938, and perform demodulating and decoding operations for retrieving the test stimuli for the integrated circuit ICA. Moreover, the communication unit 941 integrated in the semiconductor chip 912 is adapted to collect the signal component at the second modulation frequency from the supply voltage line 938, and perform demodulating and decoding operations for retrieving the test stimuli for the integrated circuit ICB.

The concepts of the present invention can be applied to further 3D IC structure configurations, different from that illustrated in the FIGS. 9A-9C.

For example, the integrated circuits ICA and ICB may share the same reference voltage line adapted to convey a reference voltage to be used by both the integrated circuits, but each integrated circuit ICA, ICB may be coupled with a respective supply voltage line adapted to convey a dedicated supply voltage. In this case, by providing each semiconductor chip 906, 912 with a communication unit comprising a transponder/transceiver and a filter coupled with the respective supply voltage line, test stimuli and test response signals for both the integrated circuits can be encoded and modulated for being advantageously transmitted over the supply voltage lines.

Moreover, even in case the 3D IC structure comprises a higher number of vertically stacked semiconductor chips sharing the same internal supply bus, each semiconductor chip may be advantageously provided with a respective communication unit coupled with the internal supply bus. In this way, the test stimuli and the test response signals may be encoded and modulated for being transmitted over the internal supply voltage, in such a way to allow a reduction in the number of probes necessary to perform the testing on the semiconductor chips forming the stack.

If the semiconductor chip 906 of the top device level has a size smaller than the size of the semiconductor chip 912 belonging to the adjacent (lower) device level, portions of the top surface 914 of the semiconductor chip 912 may, as a result, not be covered by the semiconductor chip 906. In this way, the semiconductor chip 912 may be provided with contact pads on said uncovered portions of its top surface 914, which can be directly accessed by probes of the probe card 125 during the testing. However, even in this case, the number of probes of the probe card 125 necessary for performing the testing may be reduced by implementing a communication unit coupled with the supply bus in at least one among the semiconductor chips 906 and 912, in the same ways as previously described.

Figure 9D:
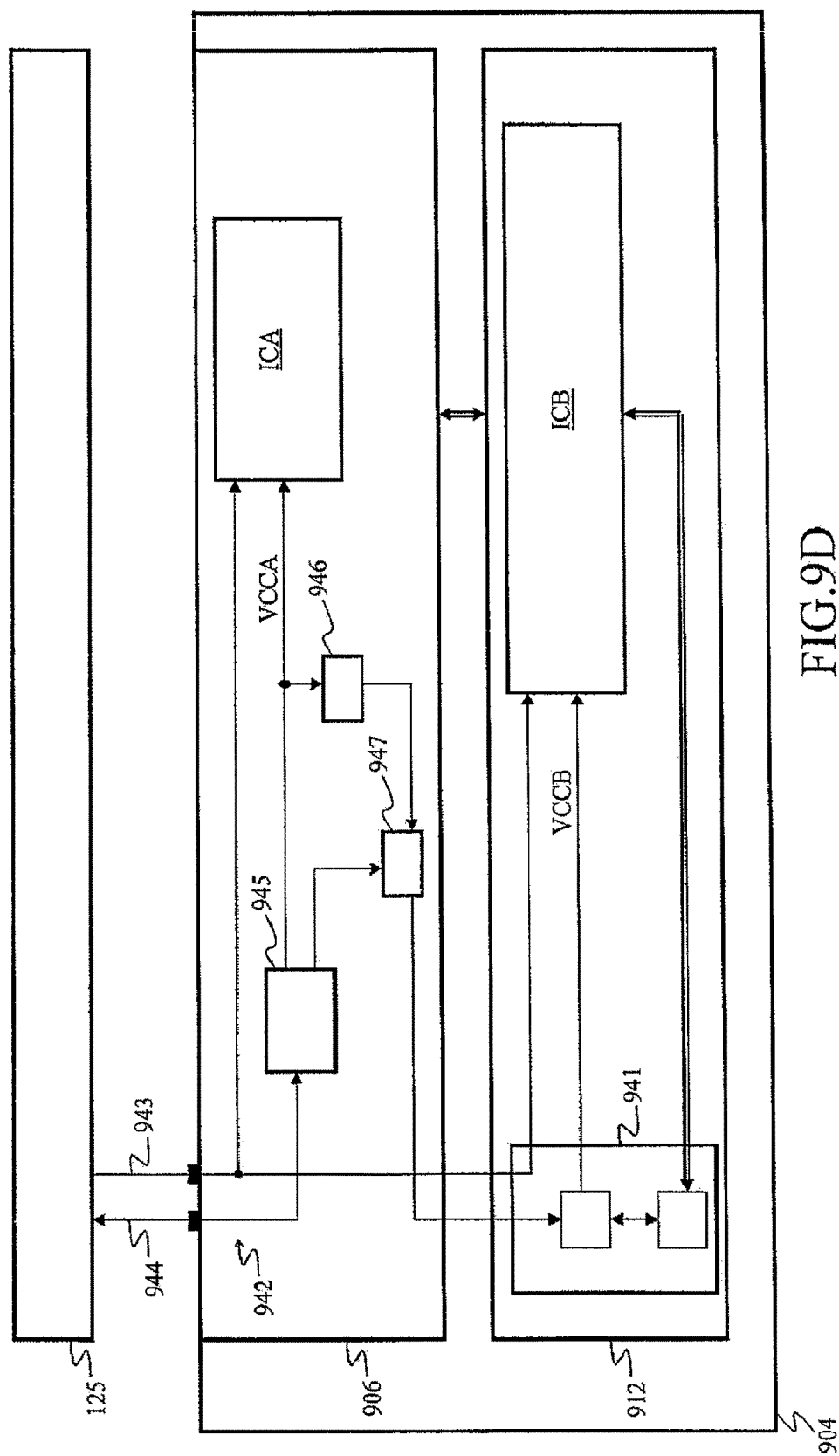

A quite different scenario of application of the concepts of the present invention is illustrated in FIG. 9D. Particularly, in the scenario illustrated in FIG. 9D, the supply voltages VCCA, VCCB required for operating the integrated circuits ICA and ICB of the 3D IC structure 904 have different values, but the 3D IC structure 904 is provided with a single supply bus 942 only, and particularly including a single reference voltage line 943 and a single supply voltage line 944. In the same way as previously described, the supply voltage VCCA (which is substantially constant) superimposed with encoded and modulated (at a predetermined modulation frequency) test signals generated by the probe card 125 are conveyed over the supply voltage line 944.

The semiconductor chip 906 includes a filter circuit 945 connected to the supply voltage line 944 for receiving the supply voltage VCCA mixed with the encoded and modulated test signals. The filter circuit 945 separates the constant component (corresponding to the supply voltage VCCA) from the component oscillating at the predetermined modulation frequency (corresponding to the encoded and modulated test signals). The constant component is thus provided to the integrated circuit ICA, which is also coupled with the reference voltage line 943 for receiving the reference voltage GND and to a voltage converter circuit 946, such as a DC/DC converter.

The voltage converter circuit 946 converts the constant component received from the filter which corresponds to the supply voltage VCCA into the supply voltage VCCB for the integrated circuit ICB. According to an embodiment of the present invention, the semiconductor chip 906 further includes a mixer circuit 947 having a first input coupled with the filter circuit 945 for receiving the component oscillating at the predetermined modulation frequency and corresponding to the encoded and modulated test signals generated by the probe card 125, and a second input coupled with the converter circuit 946 for receiving the supply voltage VCCB. The mixer circuit 947 mixes the component oscillating at the predetermined modulation frequency with the (substantially constant) supply voltage VCCB, conveying the resulting signal to the semiconductor chip 912, for being separated, demodulated and decoded by a proper communication unit, in the same way as previously described in reference to the FIGS. 9A-9C. In this way, with the proposed solution it is possible to further reduce the number of probes required for testing a 3D IC structure that has to be supplied with different supply voltages.

According to a still further embodiment of the present invention, the supply voltage VCCB for the integrated circuit ICB may be supplied on the supply bus 942 by means of an alternating voltage having an oscillating frequency fp that is different than the ones used for conveying the encoded and modulated test signals. In this case, the converter circuit 946 will be an AC/DC converter, which converts the alternating voltage into the (constant) supply voltage VCCB, and the filter circuit 945 will be capable of separating the component of the signal conveyed by the supply bus 942 that oscillates at the frequency fp from the components oscillating at the frequencies corresponding to the encoded and modulated test signals.

All the previously described embodiments allow testing the ICs integrated on the dies of the semiconductor wafer 110 by using a reduced, possibly very low number of contact pads and probes, thereby improving the performance and the reliability of the testing, and reducing the costs of the test equipment.

It has to be appreciated that all the ICs to be tested on the dies of the semiconductor wafer generally require to be fed with the same test stimuli, while each IC generally responds with dedicated/different test response signals, for example, to point out failures. Thus, taking into account this asymmetry, it is possible to feed the same test stimuli to a plurality of ICs in parallel on the same, shared, transmission channel using a common transmitter, while receiving the test response signals generated by the various ICs on different, dedicated, reception channels, using dedicated receivers. The number of contact pads and probes required for such testing may be reduced by exploiting one or more supply/reference voltage distribution lines for the transmission and/or reception of the test stimuli/test response signals.

Figure 10:
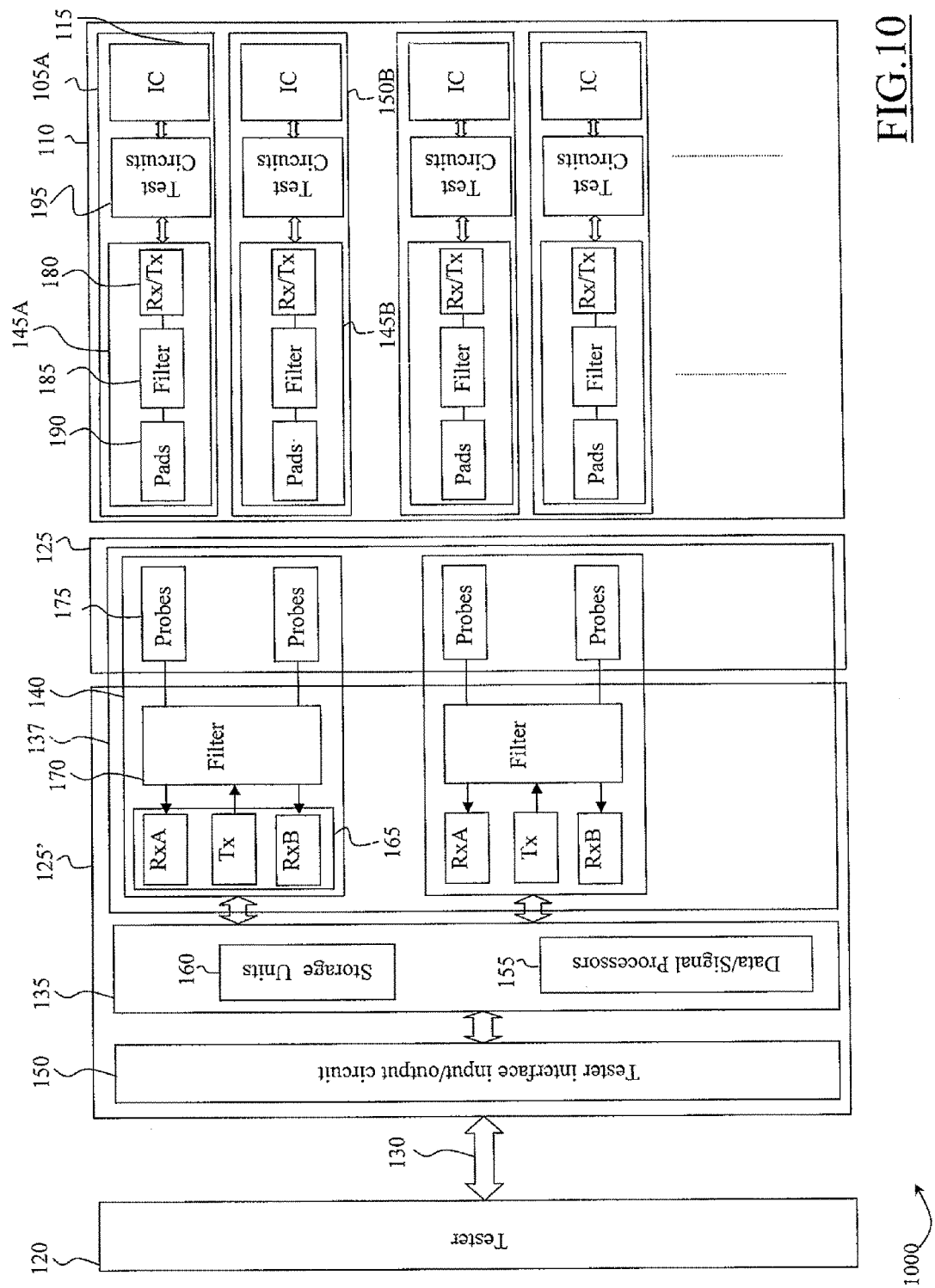
FIG. 10 schematically shows a block diagram of a test system according to another embodiment of the present invention.

An exemplary implementation of this general idea is illustrated in FIG. 10, which is a block diagram of a test system 1000 according to an embodiment of the present invention. The test system 1000 is a modified version of the previously described test system 100 illustrated in FIG. 1; therefore, the elements of the test system 1000 corresponding to elements already included in the test system 100 will be identified with the same references, and will not be described for the sake of brevity.

Compared to the case illustrated in FIG. 1, wherein each unit 140 on the probe card 125 is associated in use with a respective communication unit 145 on an IC die 105, in the test system 1000 a single unit 140 is associated with a plurality of communication units 145, and, thus, with more than one IC die 105. In the example illustrated in FIG. 10, each unit 140 is adapted to communicate with two communication units, identified with the references 145A and 145B, respectively, located on two different IC dies identified with the references 105A and 105B, respectively.

According to an embodiment of the present invention, a portion of each unit 140—specifically, the one including the transponder/transceiver and the filter unit —, the control circuit 135 and the tester interface input/output circuit 150 as well, is located on a test board (also called load board or device interface board) identified with the reference 125', which is adapted to be employed during the test operations as a coupling element between the tester 120 and the probe card 125. In this way, the probe card 125 is simplified, including the DUT interface units 175 only, and thus the test board 125' may be reused for the testing of different wafers, being sufficient replacing the probe card 125. However, it has to be appreciated that the concepts of the present invention also apply in case at least a portion of the filter units 170 is located in the probe card 125, or if the test board 125' is not present, and the units 140 are entirely located on the probe card 125.

The transponder/transceiver 165 of each unit 140 is configured to fed the communication units 145A, 145B corresponding to such unit 140 with test stimuli provided by the tester 120 and receive from the communication units 145A, 145B corresponding test response signals. According to an embodiment of the present invention, the transponder/transceiver 165 of each unit 140 comprises a single transmitter Tx configured to transmit the test stimuli received from the tester to all the respective communication units 145A, 145B associated with the unit 140 itself, and a plurality of distinct receivers RxA, RxB, each one configured to receive the test response signals received from a corresponding communication unit 145A, 145B among the ones associated with the unit 140 itself. In the example at issue, wherein each unit 140 is adapted to establish in use a communication relationship with two corresponding communication units 145A, 145B, each transponder/transceiver 165 comprises one transmitter Tx and two receivers RxA, RxB.

Figure 11:
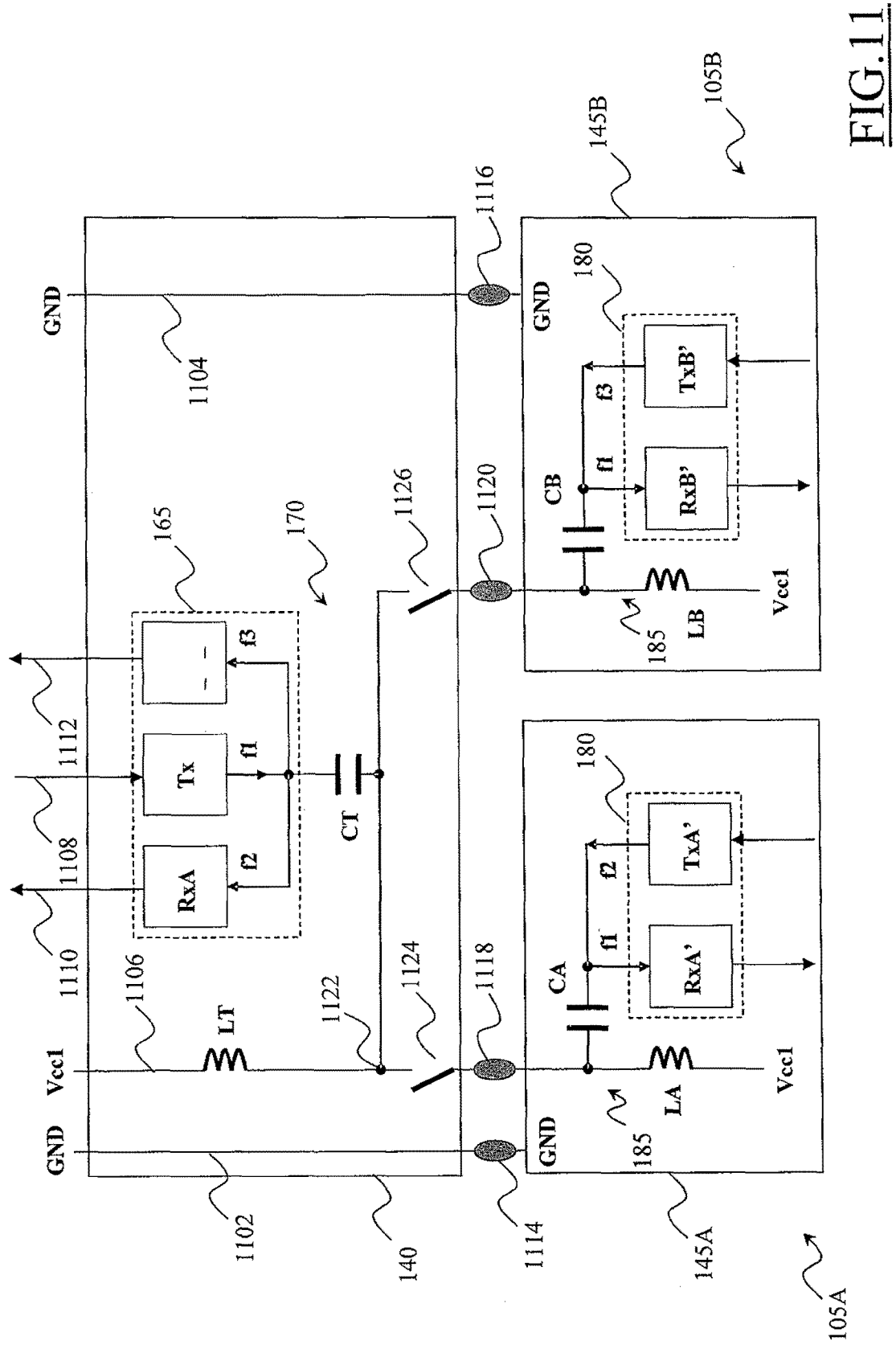
FIGS. 11-20 schematically show portions of the test system of FIG. 10 according to respective embodiments of the present invention.

Referring to FIG. 11, an exemplary implementation of the unit 140 and of the corresponding communication units 145A, 145B is shown according to an embodiment of the present invention. In order to simplify the understanding of the figure, each probe/pad pair comprising a probe located on the probe card and the corresponding pad located on the die (i.e., the corresponding pad that is configured to be contacted by the probe during the test operations) is depicted with a single pictorial element, and identified with a corresponding single reference.

In the case illustrated in FIG. 11, the communication units 145A, 145B are located on two IC dies 105A, 105B integrating respective ICs (not shown in figure) to be supplied with the same supply voltage Vcc1.

The unit 140 receives from the tester interface input/output circuit 150 (not shown in figure) the signals/supplies to be provided to the ICs of the IC dies 105A, 105B through respective distribution lines. Specifically, a first reference distribution line 1102 is configured to receive the reference voltage GND (to be provided to the IC die 105A), a second reference distribution line 1104 is configured to receive the reference voltage GND (to be provided to the IC die 105B), a supply voltage distribution line 1106 is configured to receive the supply voltage Vcc1 (to be provided to both the IC dies 105A, 105B), and a test stimuli distribution line 1108 is configured to receive the test stimuli (to be provided to both the IC dies 105A, 105B). The unit 140 provides to tester interface input/output circuit 150 the test response signals received from the communication unit 145A of the IC die 105A through a first test response distribution line 1110, and the test response signals received from the communication unit 145B of the IC die 105B through a second test response distribution line 1112. The test signal distribution line 1108 is connected to an input of the transmitter Tx, the test response distribution line 1110 to an output of the receiver RxA, and the test response distribution line 1112 to an output of the receiver RxB.

During the test operations, the reference distribution line 1102 is connectable to the IC die 105A through a corresponding probe/pad pair 1114, and the reference distribution line 1104 is connectable to the IC die 105B through a corresponding probe/pad pair 1116. Similarly, the supply voltage distribution line 1106 is connectable to the IC die 105A through a corresponding probe/pad pair 1118, and to the IC die 105B through a further corresponding probe/pad pair 1120.

In the example at issue, the filter unit 170 comprises an inductor LT having a first terminal connected to the supply voltage distribution line 1106 and a second terminal connected to a first terminal of a capacitor CT (circuit node 1122). The capacitor CT has a second terminal connected to an input terminal of the receiver RxA, to an input terminal of the receiver RxB, and to an output terminal of the transmitter Tx. The circuit node 1122 is further coupled to the probe-side of the probe/pad pair 1118 and to the probe-side of the probe/pad pair 1120.

The transponder/transceiver 180 of the communication unit 145A includes a receiver RxA' and a transmitter TxA', while the transponder/transceiver 180 of the communication unit 145B includes a receiver RxB' and a transmitter TxB'.

The filter unit 185 of the communication unit 145A includes an inductor LA having a first terminal connected to the pad-side of the probe/pad pair 1118 and a second terminal connected to the IC of the IC die 105A (not shown in the figure). The filter unit 185 of the communication unit 145A further includes a capacitor CA having a first terminal connected to the first terminal of the inductor LA and a second terminal connected to an input terminal of the receiver RxA' and to an output terminal of the transmitter TxA'.

The filter unit 185 of the communication unit 145B includes an inductor LB having a first terminal connected to the pad-side of the probe/pad pair 1120 and a second terminal connected to the IC of the IC die 105B (not shown in the figure). The filter unit 185 of the communication unit 145B further includes a capacitor CB having a first terminal connected to the first terminal of the inductor LB and a second terminal connected to an input terminal of the receiver RxB' and to an output terminal of the transmitter TxB'.

During the test operations, the reference voltage GND is fed to the communication units 145A and 145B. Specifically, the ground voltage GND is directly provided to the communication units 145A and 145B through the reference distribution lines 1102, 1104 and the probe/pad pairs 1114, 1116, respectively.

According to an embodiment of the invention, the test stimuli are encoded and modulated by the transmitter Tx, which outputs a corresponding signal having a first frequency f1. Since the inductor LT has a very low impedance in DC and the capacitor CT is configured to have a very low impedance at the first frequency f1, the resulting signal at the circuit node 1122 is the superimposition of the supply voltage Vcc1 and the test signal. The supply voltage Vcc1 does not reach the transponder/transceiver 165, being blocked by the high impedance of the capacitor CT (which, ideally, behaves as an open circuit in DC), while the test signal does not reach the supply voltage distribution line 1106, being blocked by the inductor LT, which has been configured to have a high impedance at the first frequency f1.

Such combined signal reaches the communication unit 145A through the probe/pad pair 1118, wherein the filter 185 separates the DC component from the signal component at the first frequency f1. The DC component, corresponding to the supply voltage Vcc1, is made available at the IC of the IC die 105A, since the inductor LA has a low impedance in DC. In DC, the capacitor CA has a high impedance (ideally, it behaves as an open circuit), thus the DC component of the signal (i.e., the supply voltage Vcc1) does not reach the transponder/transceiver 180. The signal component at the first frequency f1 is made available at the input terminal of the receiver RxA', since the capacitor CA is configured to have a very low impedance (ideally, zero) at the frequency f1. Moreover, the signal component is blocked by the inductor LA, which has been configured to have a very high impedance at the first frequency f1. The receiver RxA' demodulates and decodes the signal component, so as to output the test stimuli to the test circuitry (e.g. BIST) of the IC 105A (not shown in the figure). Test response signals are generated by the IC in response to said test stimuli; the test response signals are encoded and modulated by the transmitter TxA', which outputs a corresponding signal having a second frequency f2. Said signal is superimposed on the supply voltage Vcc1 and is provided to the input terminal of the receiver RxA of the unit 140 following the same path of the test stimuli, since the both the capacitor CA of the filter unit 185 and the capacitor CT of the filter unit 170 are configured to have a very low impedance at the second frequency f2 as well. Then, once the test response signals are demodulated and decoded by the receiver RxA, they are sent back to the tester (not illustrated) through the test response distribution line 1110.

Similarly, the combined signal generated at the circuit node 1122 reaches the communication unit 145B through the probe/pad pair 1120, wherein the filter 185 separates the DC component from the signal component at the first frequency f1. The DC component, corresponding to the supply voltage Vcc1, is made available at the IC of the IC die 105B, since the inductor LB has a low impedance in DC. In DC, the capacitor CB has a high impedance, thus the DC component of the signal (i.e., the supply voltage Vcc1) does not reach the transponder/transceiver 180. The signal component at the first frequency f1 is made available at the input terminal of the receiver RxB', since the capacitor CB is configured to have a very low impedance at the frequency f1. Moreover, the signal component is blocked by the inductor LB, which has been configured to have a very high impedance at the first frequency f1. The receiver RxB' demodulates and decodes the signal component, so as to output the test stimuli to the test circuitry of the IC 105B (not shown in the figure). Test response signals are generated by the IC in response to said test stimuli; the test response signals are encoded and modulated by the transmitter TxB', which outputs a corresponding signal having a third frequency f3. Said signal is superimposed on the supply voltage Vcc1 and is provided to the input terminal of the receiver RxB of the unit 140 following the same path of the test stimuli, since the both the capacitor CB of the filter unit 185 and the capacitor CT of the filter unit 170 are configured to have a very low impedance at the third frequency f3 as well. Then, once the test response signals are demodulated and decoded by the receiver RxB, they are sent back to the tester (not illustrated) through the test response distribution line 1112.

Thus, in the exemplary embodiment illustrated in FIG. 11, two dies can be tested at the same time, with only four input/output contact pads that need to be contacted by probes. It has to be appreciated that the same considerations apply both in case the test stimuli and the test response signals are analog signals, and in case said signals are digital.

According to an embodiment of the present invention, protection devices may be provided against the occurrence of possible short circuits in the IC dies 105A, 105B. Said protection devices may be provided on the supply voltage distribution line; for example, the unit 140 may be provided with a first relay 1124 between the circuit node 1122 and the probe-side of the probe/pad pair 1118 and a second relay 1126 between the circuit node 1122 and the probe-side of the probe/pad pair 1120. In case a potential short circuit occurs at an IC die, the corresponding relay is opened, allowing the carrying out of the testing on the other IC dies. Similar considerations apply if the protection devices (e.g., relays) are provided on the reference distribution lines.

According to a further embodiment of the present invention, the overall performances are improved by providing the input terminal of each transmitter and the output terminal of each receiver (both on the unit 140 and on the communication units 145A and 145B) with a respective dedicated filter element adapted to allow the passage of the signal component at a corresponding designed frequency only, i.e., the frequency of the signal which the transmitter/receiver is designed to transmit/receive.

In order to reduce as much as possible the influence of the transponder/transceiver 180 and the filter unit 185 on the operation of the ICs of the IC dies 105A, 105B, the frequencies f1, f2, f3 used for the modulation of the test stimuli and of the test response signals should be preferably outside the frequency bandwidth of the power supply noise spectrum. In this regard, it has to be underlined that the frequency bandwidth of the power supply noise spectrum during the testing operations is substantially different than the one during the normal operation of the IC, since, during the test operations, the ICs are heavily stressed, and the current consumptions is at maximum. Moreover, the frequency bandwidth of the power supply noise spectrum strongly depends on the specific nature of the ICs (for example, an IC including a large digital portion generally has a wider power supply noise spectrum compared to the one of an IC having a small digital portion). Therefore, according to an embodiment of the present invention, the filter units and the transponder/transceivers are programmable, so as to allow to vary at least one of their parameters, for example, the frequencies f1, f2, f3 based on the IC type, the cut off frequencies, the gain, the coding, the modulation, etc.

Figure 12:
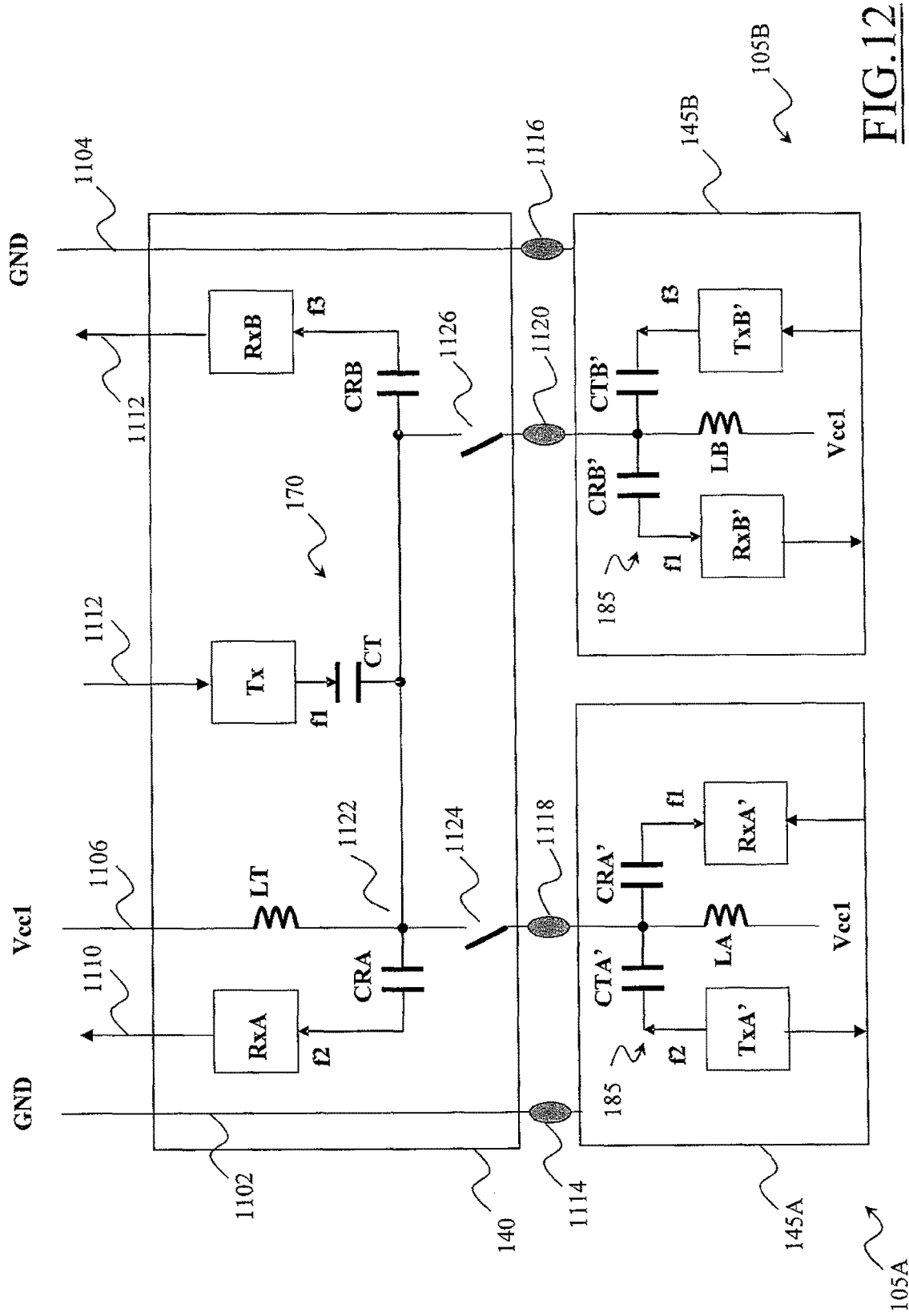

In the example illustrated in FIG. 12, said dedicated filter elements are implemented with capacitors. Specifically, the filter unit 170 of the unit 140 includes a first capacitor CT having a first terminal connected to the output terminal of the transmitter TX and a second terminal connected to the circuit node 1122, a second capacitor CRA having a first terminal connected to the input terminal of the receiver RxA and a second terminal connected to the circuit node 1122, and a third capacitor CRB having a first terminal connected to the input terminal of the receiver RxA and a second terminal connected to the circuit node 1122. Moreover, the filter unit 185 of the communication unit 145A includes a first capacitor CTA' having a first terminal connected to the output terminal of the transmitter TxA' and a second terminal connected to the pad-side of the probe/pad pair 1118, and a second capacitor CRA' having a first terminal connected to the input terminal of the receiver RxA' and a second terminal connected to the second terminal of the capacitor CTA'. Furthermore, the filter unit 185 of the communication unit 145B includes a first capacitor CTB' having a first terminal connected to the output terminal of the transmitter TxB' and a second terminal connected to the pad-side of the probe/pad pair 1120, and a second capacitor CRB' having a first terminal connected to the input terminal of the receiver RxB' and a second terminal connected to the second terminal of the capacitor CTB'. The capacitors CT, CRA' and CRB' are configured to have a low impedance at the frequency f1, the capacitors CRA and CTA' at the frequency f2, and the capacitors CRB and CTB' at the frequency f3.

Figure 13:
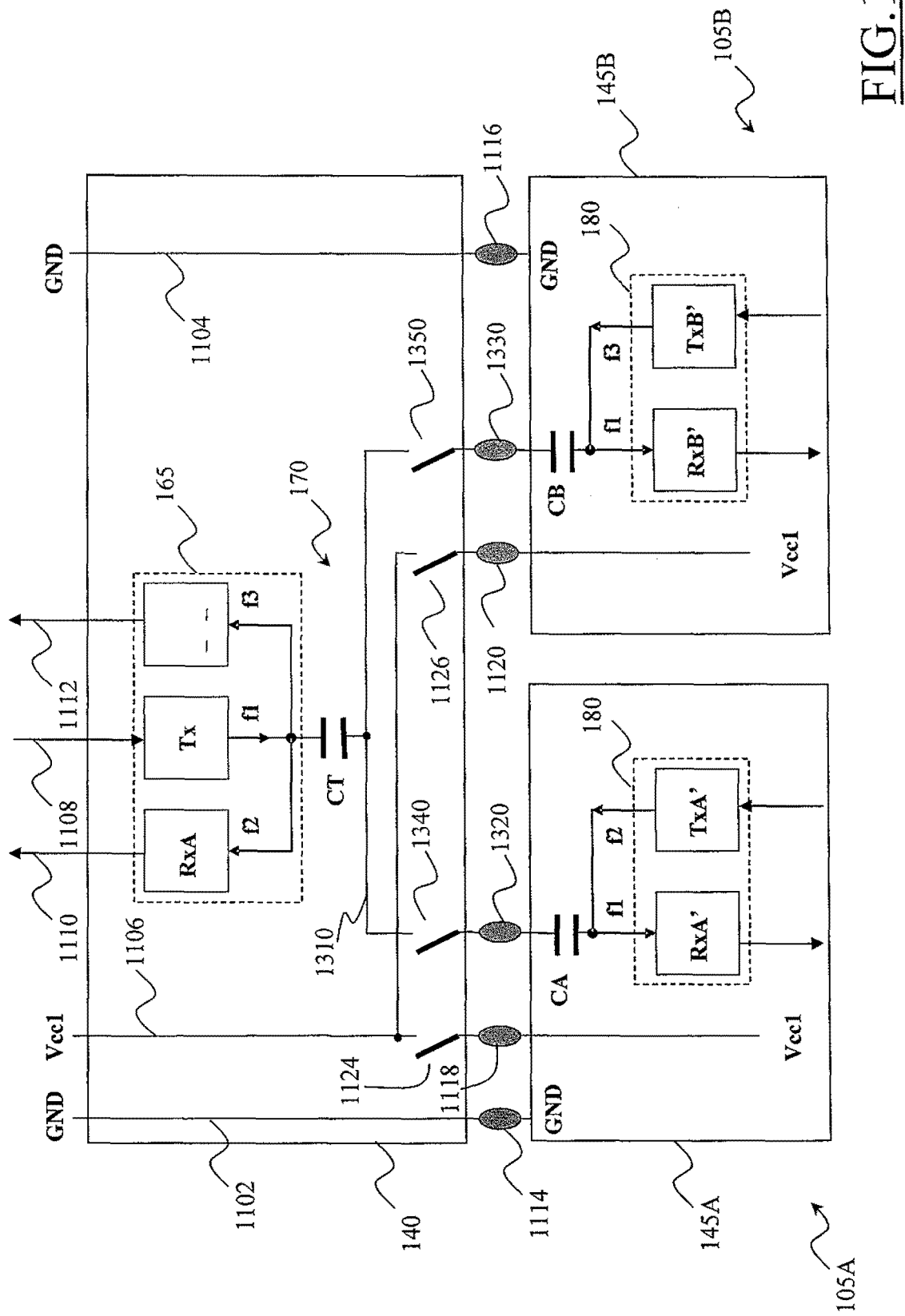

According to a still further embodiment of the present invention illustrated in FIG. 13, the transmission and reception of the test stimuli and of the test response signals may be carried out on a channel that is different than the one dedicated to the supply voltage. Making reference to FIG. 13, the supply voltage Vcc1 is directly provided to the IC of the IC dies 105A, 105B through the supply voltage distribution line 1106, while the test stimuli and the test response signals are conveyed on a dedicated distribution line 1310 connected to the filter unit 170. During the testing, the distribution line 1310 is coupled with the filter unit 185 of the communication unit 145A through a first corresponding probe/pad pair 1320 and to the filter unit 185 of the communication unit 145B through a second corresponding probe/pad pair 1330. Since the supply voltage and the test stimuli/test response signals are conveyed on separated lines, which are insulated from each other, the inductors LT, LA and LB are no more required. In order to prevent occurrences of short circuits, further protection devices may be provided, for example, a relay 1340 between the filter unit 170 and the probe-side of the probe/pad pair 1320 and a relay 1350 between the filter unit 170 and the probe-side of the probe/pad pair 1330.

Figure 14:
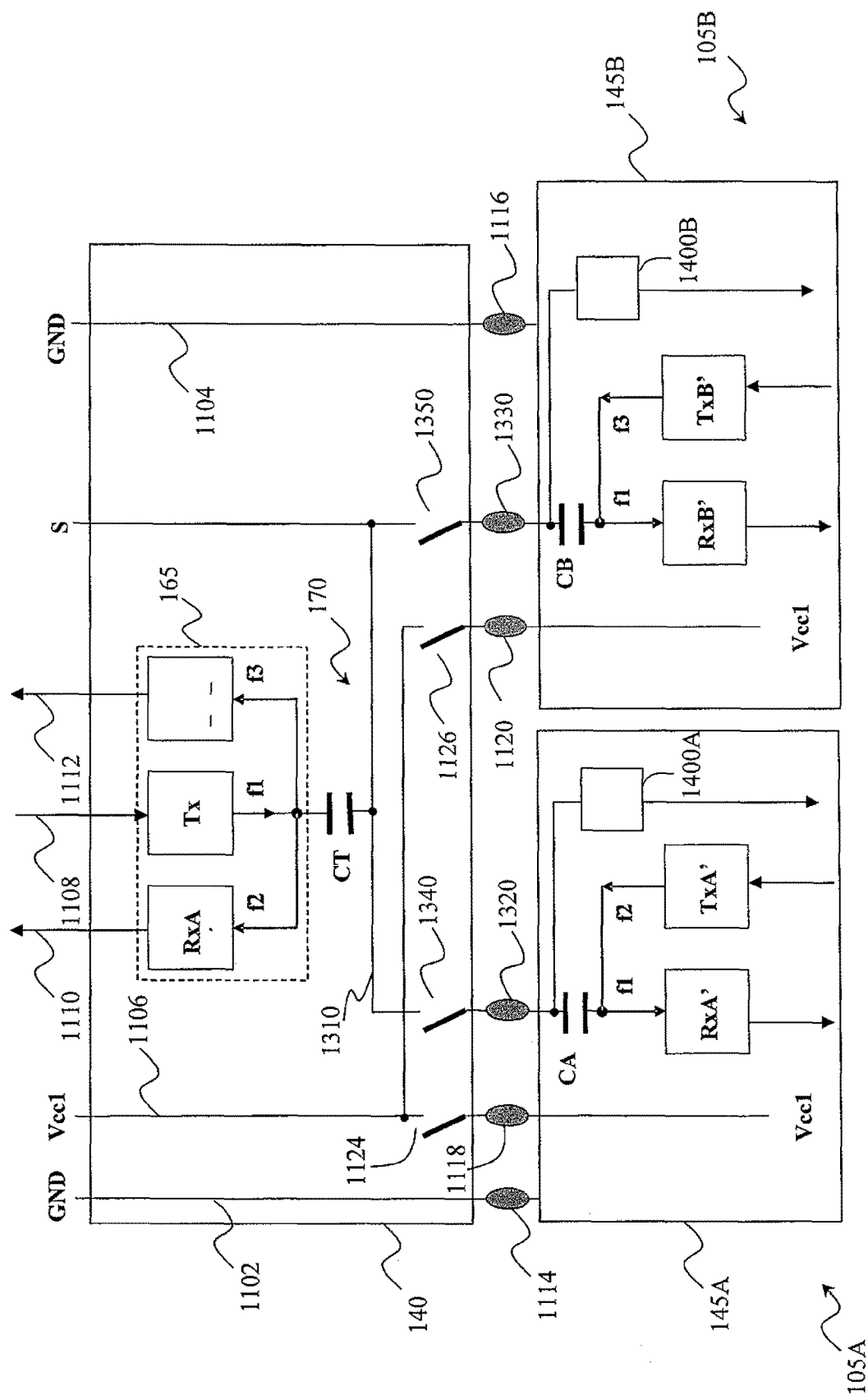

According to a further embodiment of the present invention illustrated in FIG. 14, the dedicated distribution line 1310 through which the test stimuli and the test response signals are conveyed may be further exploited for conveying a further signal—identified in the figure with the reference S—to be provided to the IC dies 105A, 105B. According to an embodiment of the present invention, said signal S occupies a frequency bandwidth that does not overlap with any of the frequencies f1, f2, f3 exploited by the transmitters and receivers, and it is mixed to the test stimuli and the test response signals carried on the distribution line 1310. At the IC dies 105A, 105B, the signal S is separated from the combined signal by means of corresponding filter circuits 1400A, 1400B, respectively. According to a still further embodiment of the present invention, the frequency bandwidth of the signal S may overlap with at least one of the frequencies f1, f2, f3, providing to employ the Code Division Multiple Access (CDMA) method, or an equivalent multiplex technique.

Figure 15:
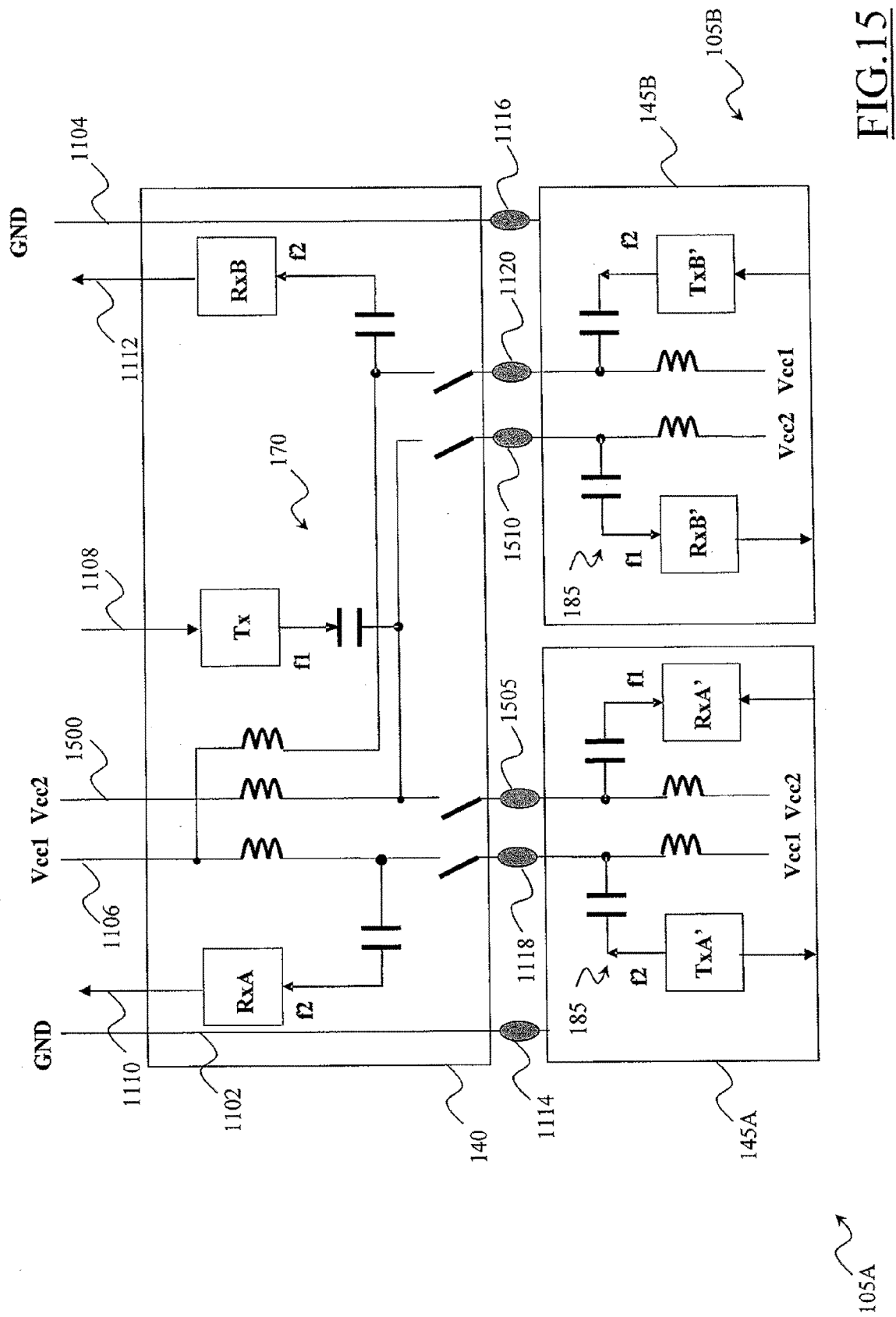

According to an embodiment of the invention, the transmission of the test stimuli from the unit 140 to the communication units 145A, 145B and the transmission of the test response signals from the communication units 145A, 145B to the unit 140 may be carried out on two separate channels. This is particularly advantageous if the ICs integrated in each IC die 105A, 105B require to be supplied with two supply voltages Vcc1, Vcc2, as in the exemplary case illustrated in FIG. 15. In this example, a further supply voltage distribution line 1500 is configured to provide a second supply voltage Vcc2 to the communication unit 145A through a first probe/pad pair 1505 and to the communication unit 145B through a second probe/pad pair 1510. According to an embodiment of the present invention, the transmission of the test stimuli from the transmitter Tx of the unit 140 to the receivers RxA', RxB' of the communication units 145A, 145B is carried out using the supply voltage distribution line 1500 for the distribution of the supply voltage Vcc2, while the transmission of the test response signals from each transmitter TxA', TxB' of the communication units 145A, 145B to the receivers RxA, RxB is carried out exploiting the supply voltage distribution line 1106 for the distribution of the supply voltage Vcc1. Naturally, similar considerations apply in case the supply voltage distribution lines are exchanged to each other. The test stimuli are encoded and modulated by the transmitter Tx so as to obtain a corresponding signal having a frequency f1, which is superimposed on the supply voltage Vcc2 on the supply voltage distribution line 1500. The test response signals generated by the IC of the IC die 105A are encoded and modulated by the transmitter TxA' of the communication unit 145A so as to obtain a corresponding signal having a frequency f2, which is superimposed on the supply voltage Vcc1 on the supply voltage distribution line 1108. Similarly, the test response signals generated by the IC of the IC die 105B are encoded and modulated by the transmitter TxB' of the communication unit 145B so as to obtain a corresponding signal having a frequency f2, which is superimposed to the supply voltage Vcc1 on the supply voltage distribution line 1108. In the example illustrate in FIG. 15, the filter elements required to keep separated the various components of the signals transmitted/received include respective capacitors at the input/output terminals of the receivers/transmitters, and respective inductors in the supply voltage distribution lines, both at the inputs of the unit 140 and at the outputs of the communication units 145A, 145B. It has to be appreciated that in the case illustrated in FIG. 15, the signals generated by the transmitters TxA' and TxB' may advantageously have the same frequency f2 (simplifying the overall complexity of the system) since the filter elements are such to avoid any mixing thereof;

moreover, according to a further embodiment of the present invention, also the frequency f1 may be equal to the frequency f2.

In order to avoid the flowing of excessive amounts of current through a single pad, each IC die generally has more than one pad dedicated for each supply voltage. According to an embodiment of the present invention, this feature can be exploited for providing additional supply voltage distribution lines which are connected in parallel to the ones exploited for the transmission of the test stimuli and test response signals, but which are configured to convey the supply voltages only, bypassing the filter used to separate the DC components from the signal components. In this way, it is assured that the supply voltages actually provided to the ICs during the test operations are more stable, with a lesser amount of undesired oscillations or noise caused by the test stimuli and test response signals.

Figure 16:
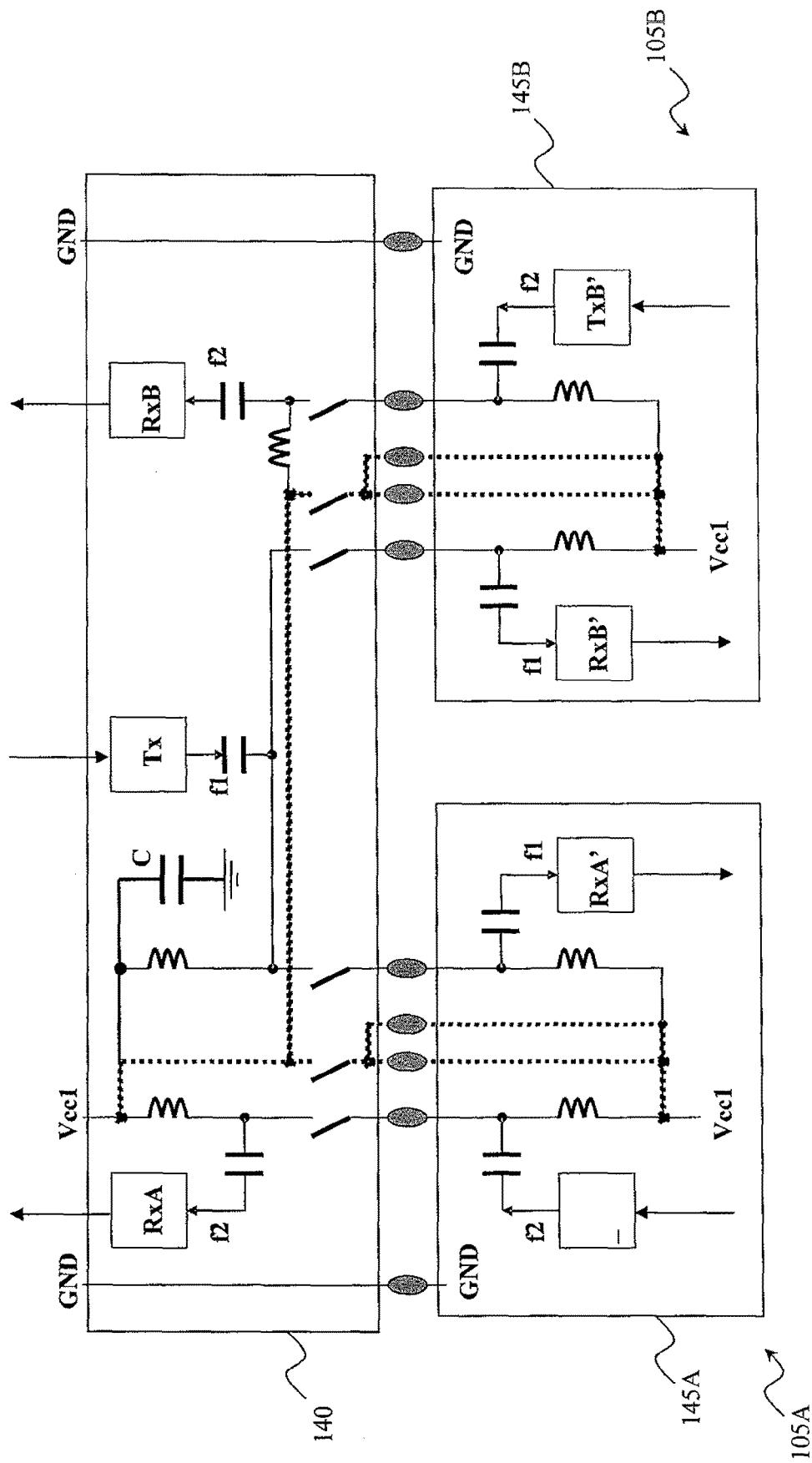

In the example illustrated in FIG. 16, each IC of the IC dies 105A, 105B is provided with four pads adapted to receive the supply voltage Vcc1. In this case, according to an embodiment of the present invention, while two of said four pads are exploited for conveying a combined signal comprising a DC component (the supply voltage Vcc1) and a signal component (the test stimuli or the test response signals) as previously described, the other two pads are exploited for conveying the supply voltage Vcc1 only, without any signal superimposed thereon. Making reference to FIG. 16, it can be observed that during the test operations there exists for each IC die 105A, 105B a corresponding conductive path that bypasses all the filter elements and allows the supply voltage Vcc1 to be directly provided to the corresponding ICs. These conductive paths are depicted in FIG. 16 with a thick dashed line. A filter capacitor, identified in figure with the reference C, may be further provided for reducing the noise on the supply voltage Vcc1.

Figure 17:
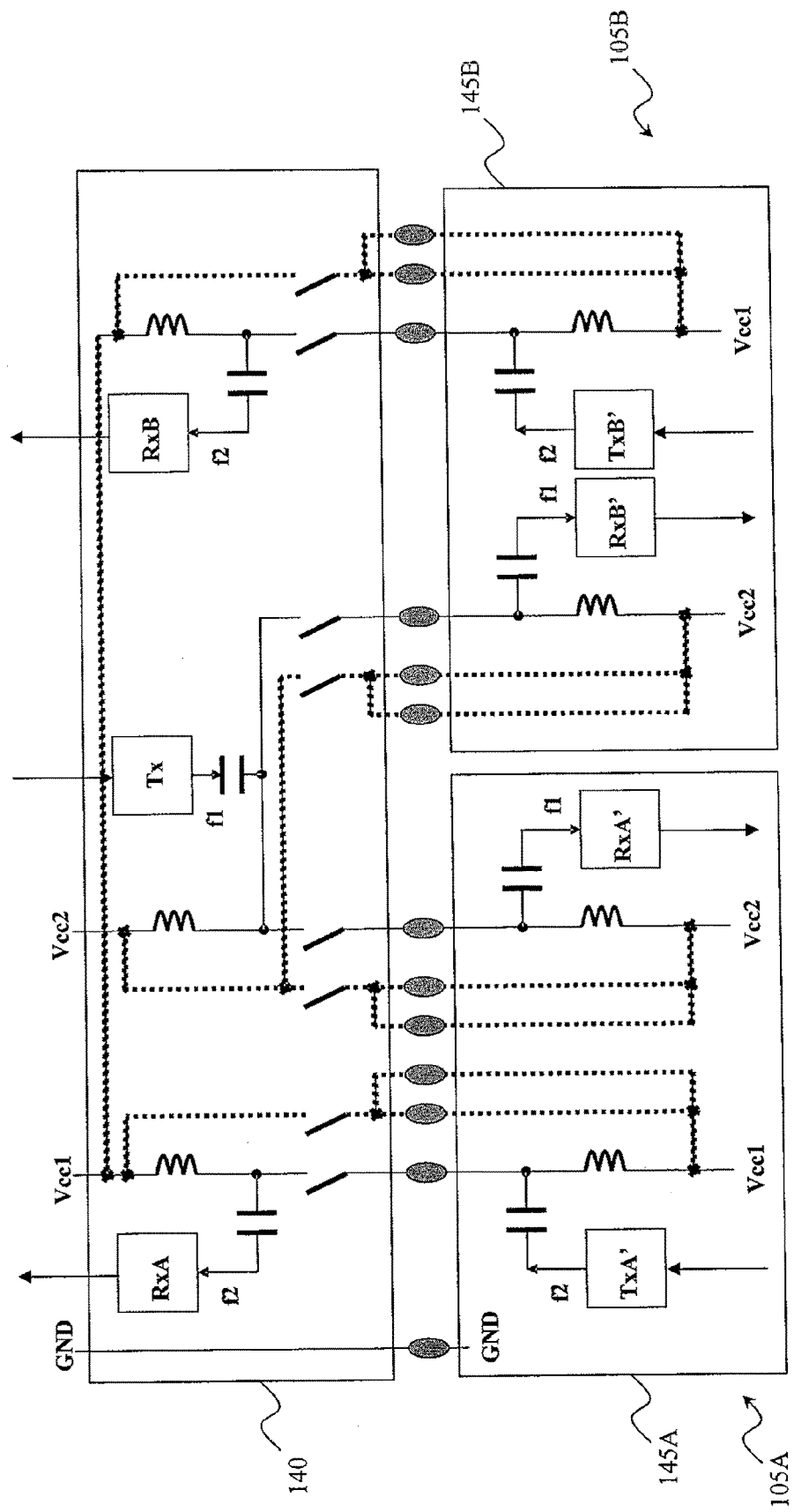

In the example illustrated in FIG. 17, each IC of the IC dies 105A, 105B is provided with three pads adapted to receive the supply voltage Vcc1 and three pads adapted to receive the supply voltage Vcc2. In this case as well, the conductive paths that bypass the filter elements and allow the supply voltages Vcc1 and Vcc2 to be directly provided to the ICs are depicted with a thick dashed line.

Figure 18:
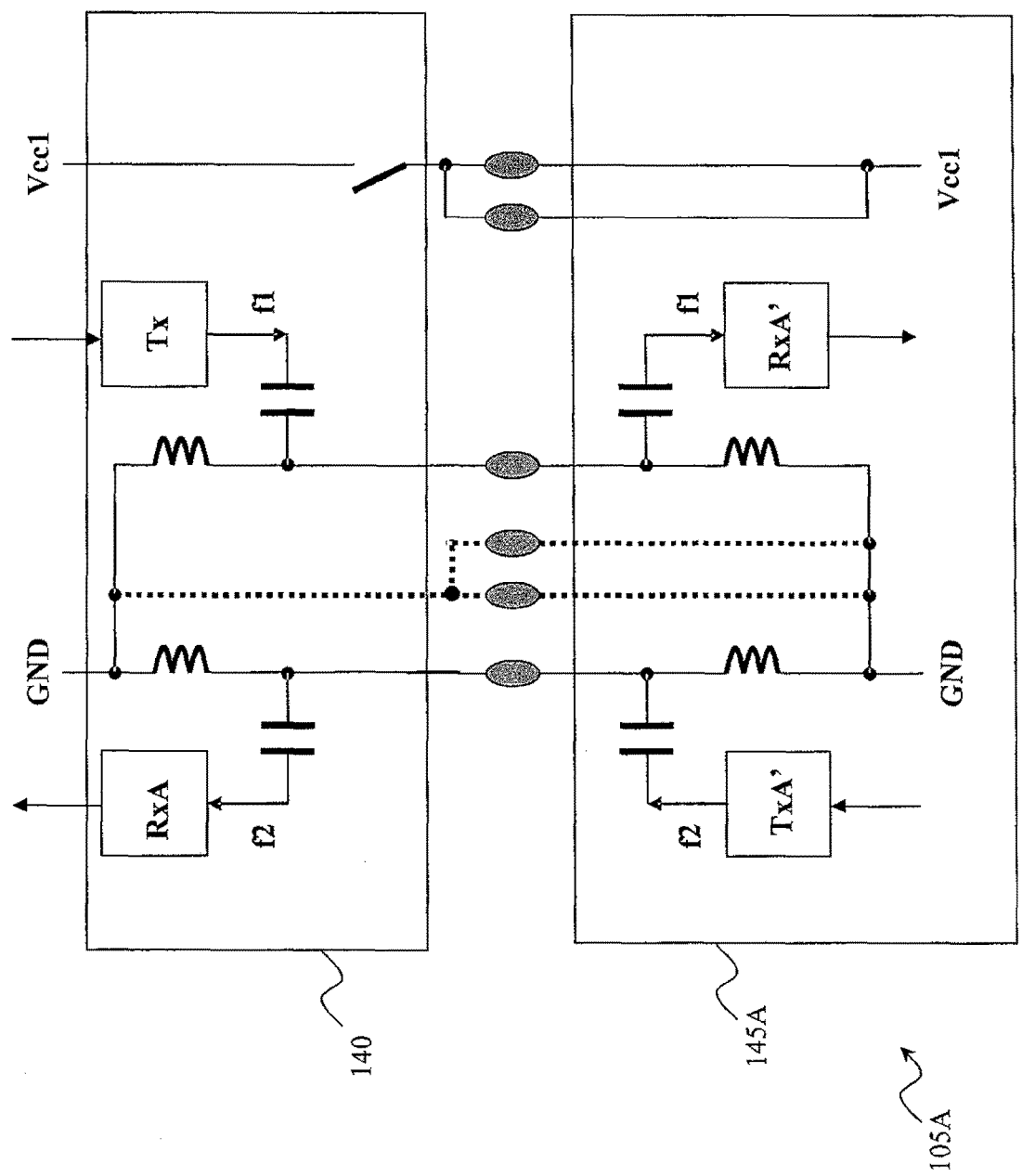

All the considerations previously made with reference to the embodiments illustrated in FIG. 11-17 may be also applied in case the test stimuli and/or the test response signals are conveyed on the reference distribution line(s), for being superimposed to the ground voltage GND, instead of being conveyed on the supply distribution line(s), for being superimposed to the supply voltage(s). Without entering into excessive details for the sake of brevity, in the example illustrated in FIG. 18 the reference distribution line is used for conveying both the test stimuli and the test response signals. Since the reference distribution line is shared by more than one IC, with a solution of this type it is possible to transmit the test stimuli from the tester to the ICs with a high degree of parallelism. In case the reference distribution line is shared by all the ICs of the semiconductor wafer, such degree of parallelism may reach the highest possible value. Advantageously, since the reference distribution line is configured to convey the reference voltage of the system (the ground voltage GND), protection devices are no more required, and the system's complexity may be further reduced.

Figure 19:
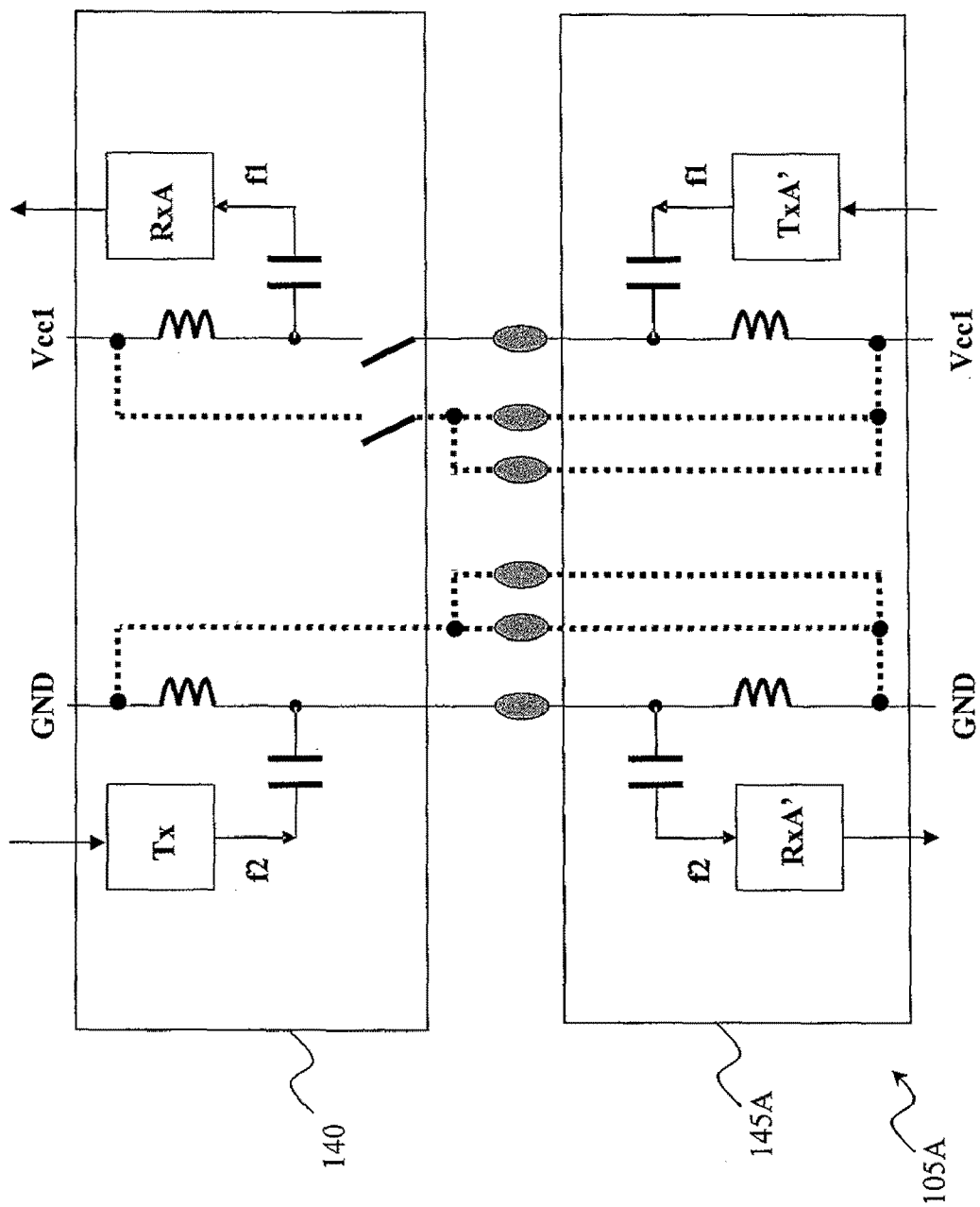

Mixed implementations are also contemplated, wherein the test stimuli are conveyed on the reference distribution line and the test response signals are conveyed on the supply voltage distribution line (see, for example, FIG. 19), and vice versa.

Figure 20:
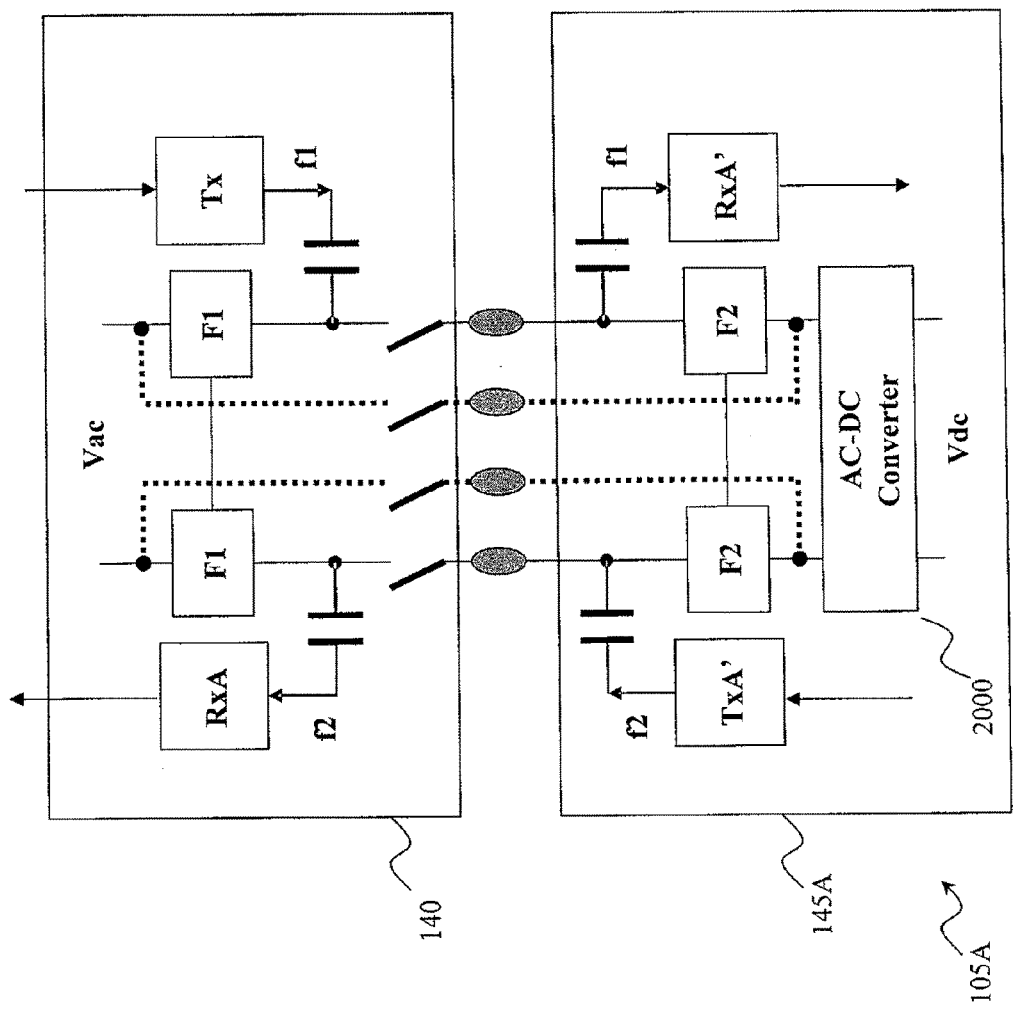

Moreover, similar considerations apply for the implementations in which the supply voltages for the IC of the IC dies are alternate (AC) quantities, for example, locally converted into corresponding DC quantities by respective AC-DC converters provided in the IC dies themselves. An exemplary implementation of this type is illustrated in FIG. 20, wherein an AC supply voltage Vac provided by the tester (not shown in figure) is converted into a DC supply voltage Vdc by an AC-DC converter 2000; with the references F1 and F2 there are identified the filters to be used for separating the test stimuli/test response signals from the AC supply voltage Vac, which operate in an equivalent way as the filter element of the previous cases.

Reassuming, according to the embodiments of the present invention illustrated in FIGS. 10-20, the group of IC dies 105 to be tested in parallel by a generic unit 140 are fed with test stimuli that are encoded and modulated at the same frequency, while each communication unit 145 belonging to an IC die of the group responds with test response signals that may be encoded and modulated at a respective, different frequency.

For example, if each unit 140 is configured to feed a corresponding group of n IC dies 105(i) (i=1, 2, . . . n), n+1 different frequencies fi are required, and specifically a first frequency f1 for the transmission of the test stimuli from the unit 140 to the n corresponding IC dies 105(i), a second frequency f2 for the transmission of the test response signals from the IC die 105(1) to the unit 140, a third frequency f3 for the transmission of the test response signals from the IC die 105(2) to the unit 140, . . . , and a frequency fn+1 for the transmission of the test response signals from the IC die 105(n) to the unit 140. Each IC die 105(i) of the group differs from the other IC dies 105(i) of the same group, since its corresponding communication unit 145 has to include a transponder/transceiver 180 adapted to encode and modulate the test response signals at the frequency fi and a filter unit 185 specifically calibrated not to block the frequency fi. According to an embodiment of the present invention, this differentiation is carried out during the manufacturing process, for example, by trimming a respective reference element located on each IC die 105(i) (e.g., a resistor, a capacitor, an inductor, a conductive path, a non-volatile memory element and the like) based on the corresponding frequency fi. Since each group of IC dies 105(i) interacts with the respective unit 140 only, it is possible to reuse the same frequencies f2, f3, . . . fn+1 for each group; the frequency f1 used for transmitting the test stimuli may be instead the same for all the ICs of the wafer. In this way, the generic i-th IC 105(i) of a group is identical to the corresponding i-th ICs 105(i) of the other groups. Advantageously, the IC dies 105(i) forming each group may correspond to dies that are processed in the same step of the manufacturing process through a lithographic mask.

Figure 21:
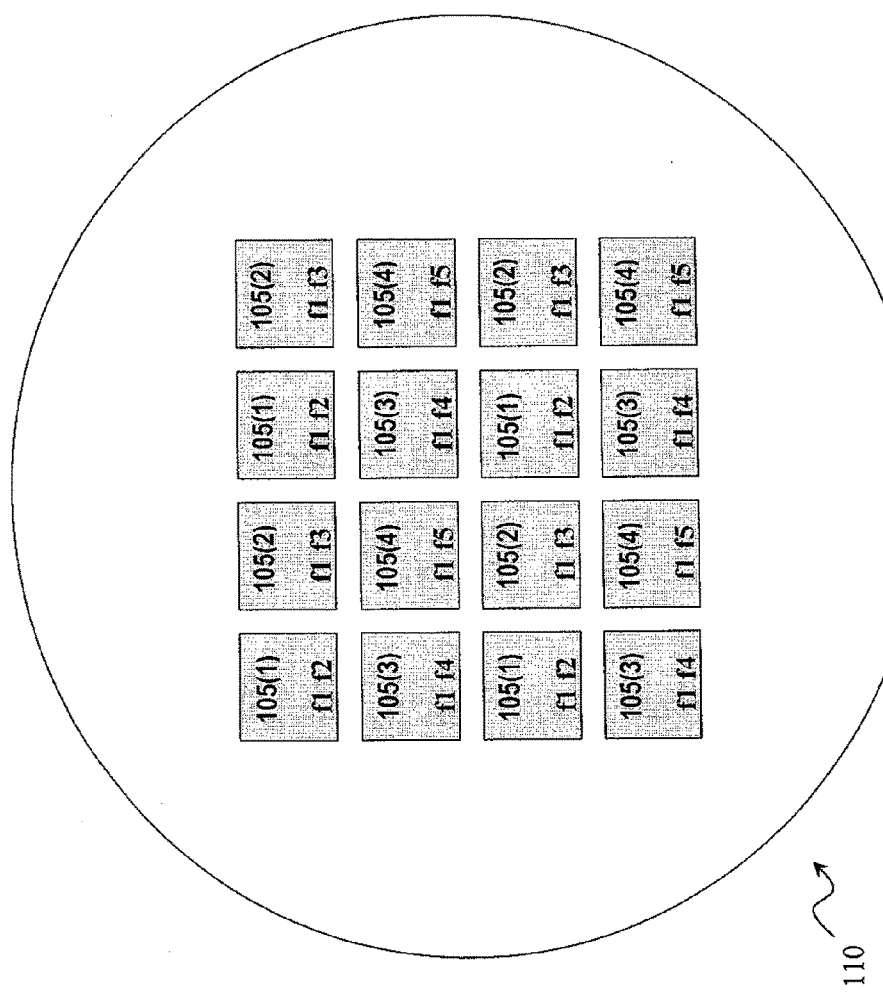
FIG. 21 shows an exemplary die arrangement on a semiconductor wafer according to an embodiment of the present invention.

In the very simplified example illustrated in FIG. 21, wherein the semiconductor wafer 110 comprises sixteen IC dies arranged on a 4×4 matrix, each unit 140 is configured to fed a corresponding group of four IC dies 105(i) (i=1, 2, 3, 4). In this example, the four IC dies 105(i) in each group are arranged in a pattern of a 2×2 matrix, so that the groups of IC dies 105(i) are arranged on the semiconductor wafer 110 according to a 2×2 matrix, too. Similar considerations apply if the pattern has a different shape, such as rectangular, triangular, linear (horizontal, vertical, diagonal), and the like.

According to a further embodiment of the present invention, each IC die 105(i) of the group is provided with at least one non-volatile memory element (e.g. FAMOS, fuse link, anti-fuse link, and the like) which, before the testing operations, is unprogrammed; the IC dies are provided with proper control circuits (not illustrated) configured to control the operations of the transponder/transceiver 180 based on the value stored in said memory element. As long as such memory element is unprogrammed, the control circuit drives the corresponding transponder/transceiver 180 in such a way to encode and modulate the test response signals at the frequency fi determined by the reference element that has been trimmed during the manufacturing process. After the completion of the test operations, the memory element is programmed; in this condition, the control circuit drives the corresponding transponder/transceiver 180 in such a way to encode and modulate the test response signals at a corresponding default frequency fd. In this way, when the semiconductor wafer is diced, the transponder/transceivers 180 of each (diced) chip operate at the same frequency fd, and thus the chips are indistinguishable to each other (at least from the functional point of view). The same considerations carried out for the frequency may be applied to other parameters of the transmitters/receivers as well. For example, in case a CDMA scheme had been employed, the codes used for the transmission and the receptions may be accordingly changed after the completion of the test operations.

In order to satisfy contingent and specific requirements, a person skilled in the art may apply to the solution described above many modifications and alterations. Particularly, although the present invention has been described with reference to preferred embodiments thereof it should be understood that various omissions, substitutions and changes in the form and details as well as other embodiments or hybrid forms are possible; moreover, it is expressly intended that specific elements and/or method steps described in connection with any disclosed embodiment of the invention may be incorporated in any other embodiment as a general matter of design choice.

For example, although in the present description reference has been made to transmitter and receivers adapted to encode and modulate the test stimuli and/or the test response signals in such a way to obtain corresponding signals at a specific, discrete, frequency, the concepts of the present invention apply in case such encoded and modulated signals have a more complex spectrum, having a wider frequency bandwidth. In this case, the filter elements should be correspondingly designed based on the actual spectrum of the signals.

Moreover, although in the described embodiments the transponder/transceiver of each unit on the test board/probe card includes a single transmitter for the encoding and modulation of the test stimuli to be provided to the communication units of the corresponding IC dies, similar considerations applies if more than one transmitter is provided, with each one of said transmitters that is associated to at least two corresponding IC dies.

The methodology herein described for testing ICs may be also employed for the WLBI on wafer, for the final test after that the IC have been packaged, and for the final applications.

Such alterations, modifications, and improvements are intended to be part of this disclosure, and are intended to be within the spirit and scope of the invention. Accordingly, the foregoing description is by way of example only and is not intended as limiting. The present invention is limited only as defined in the following claims and the equivalents thereto.

What is claimed is:

1. A method of testing integrated circuits, comprising:
   establishing a plurality of first physical communication channels between one transmission unit of a test equipment and a respective group of integrated circuits under test by having a plurality of first probes of the test equipment contact at least one first physical contact terminal of each integrated circuit of the respective group, the respective group comprising two or more integrated circuits;
   having the test equipment exchange, over said plurality of first physical communication channels, at least one test stimulus with each integrated circuit of the group;
   having each integrated circuit of the group establish a second physical communication channel with one of a plurality of reception units of the test equipment by having a second physical contact terminal of each integrated circuit contacted by a second probe of a plurality of second probes of the test equipment;
   having each integrated circuit of the group exchange, over said second physical communication channel, a corresponding test response signal based on the received test stimuli with the test equipment,
   wherein:
      the at least one test stimulus is exchanged by modulating at least one first carrier wave based on said at least one test stimulus, said at least one first carrier wave having at least one first frequency, and
      the test response signals of each integrated circuit of the group are exchanged by modulating a plurality of second carrier waves based on said test response signals, each integrated circuit modulating a second carrier wave using a different frequency.

2. The method of claim 1, further including:
   having each integrated circuit of the group:
      receive the at least one modulated first carrier wave;
      extract from the at least one modulated first carrier wave the at least one test stimulus;
      perform a test based on the at least one test stimulus; and
      generate said corresponding test response signal based on the performed test; and having the test equipment:
      receive from each integrated circuit of the group the plurality of second carrier waves;
      using the plurality of reception units, extract from the plurality of second carrier waves the test response signals; and
      based on the extracted test response signals, assess a functionality of each integrated circuit of the respective group.

3. The method of claim 2, wherein the plurality of first probes are the same probes as the plurality of second probes and each second physical communication channel coincides with the first physical communication channel, and
   wherein each one of said at least one second frequencies is different from the at least one first frequency.

4. The method of claim 3, wherein exchanging the at least one test stimulus and exchanging the corresponding test response signals comprises communicating a combined signal in which the test response signals are combined with said at least one test stimulus.

5. The method claim 1, comprising:
   having the test equipment supplying to the integrated circuit under test at least one supply voltage selected among:
      at least one power supply, and
      at least one reference voltage,
   wherein said at least one supply voltage is supplied through at least one among:
      said plurality of first physical communication channels combined with the at least one test stimulus, and
      said second physical communication channels combined with the test response signals.

6. The method of claim 5, wherein said having the test equipment supplying to the integrated circuit under test at least one supply voltage further comprises establishing at least one fourth physical channel between the test equipment and the integrated circuits of the respective group, said fourth physical channel being distinct from said at least one first physical communication channel and said second communication channels.

7. A method of testing integrated circuits, comprising:
establishing at least one first physical communication channel between a test equipment and a respective group of integrated circuits under test by having probes of the test equipment contacting at least one corresponding physical contact terminal of each integrated circuit of the respective group;
having the test equipment exchange, over said at least one first physical communication channel, the same test stimuli with each integrated circuit of the group;
having each integrated circuit of the group establish a corresponding second physical communication channel with the test equipment by having at least one physical contact terminal of the integrated circuit contacted by a corresponding probe of the test equipment;
having each integrated circuit of the group exchange, over said second physical communication channel, a corresponding test response signal based on the received test stimuli with the test equipment; and
having the test equipment exchange, over at least one third physical communication channel, at least one further signal with each integrated circuit of the group, at least one among said test response signals and said test stimuli being combined with said at least one further signal over the at least one third physical communication channel,
wherein:
the test stimuli are exchanged by modulating at least one first carrier wave based on said test stimuli, said at least one first carrier wave having at least one first frequency, and
the test response signals of each integrated circuit of the group are exchanged by modulating at least one respective second carrier wave based on said test response signals, each second carrier wave having at least one respective second frequency.

8. The method of claim 7, wherein said at least one third physical communication channel coincides with at least one among the first communication channel and each second communication channel, said first frequency and said at least one second frequencies being not included into the frequency spectrum of the at least one further signal.

9. A test equipment for testing integrated circuits, comprising:
a plurality of probes for establishing a plurality of first physical communication channels and a plurality of second physical communication channels between the test equipment and a respective group of integrated circuits under test by having said probes contact at least one corresponding physical contact terminal of each integrated circuit of the respective group;
a transmission unit for exchanging, over said plurality of first physical communication channels, at least one test stimulus with each integrated circuit of the group, and
a plurality of receiving units corresponding to the integrated circuits of the group, each receiving unit being configured to receive from a corresponding integrated circuit over a second physical communication channel of the plurality of second physical communication channels a corresponding test response signal based on the received test stimuli,
wherein the transmission unit is configured to exchange the test stimuli by modulating at least one first carrier wave based on said at least one test stimulus and the plurality of receiving units are configured to receive the test response signals of each integrated circuit of the group by receiving a respective second carrier wave of a plurality of respective second carrier waves, the respective second carrier wave comprising a test response signal generated by a corresponding integrated circuit, the at least one first carrier wave having at least one first frequency and each respective second carrier wave of the plurality of respective second carrier waves having at least one of a set of respective second frequencies, each frequency of the set of respective second frequencies being different.

10. The test equipment of claim 9, wherein:
each receiving unit of the plurality of receiving units includes:
means for receiving from each integrated circuit of the group the respective carrier wave, of the plurality of respective second carrier waves, produced by the integrated circuit to which the receiving unit corresponds, and
means for extracting from the respective second carrier wave the test response signals produced by the integrated circuit to which the receiving unit corresponds, and
the test equipment further comprises means for assessing a functionality of the integrated circuits based on the test response signals.

11. The test equipment of claim 10, wherein:
the plurality of probes comprise probes that are used to establish at least some of both the plurality of first physical communication channels and the plurality of second physical communication channels, and
each one of said set of second frequencies is different from the at least one first frequency.

12. The test equipment of claim 11, further including means for combining said at least one test stimuli with said test response signals to produce a combined signal for communication via at least one probe of the plurality of probes.

13. The test equipment of claim 9, further including means for supplying at least one supply voltage selected among at least one power supply and at least one reference voltage to the integrated circuit under test trough at least one among:
said at least one first physical communication channel, combined with the test stimuli, and
said second physical communication channels, combined with the test response signals.

14. A test equipment for testing integrated circuits, comprising:
a plurality of probes for establishing at least one first physical communication channel between the test equipment and a respective group of integrated circuits under test by having said probes contact at least one corresponding physical contact terminal of each integrated circuit of the respective group;
a transmission unit for exchanging, over said at least one first physical communication channel, the same test stimuli with each integrated circuit of the group, wherein each integrated circuit of the group is configured to establish a corresponding second physical communication channel with the test equipment by having at least one physical contact terminal of the integrated circuit contacted by a corresponding probe of the test equipment, a receiving unit for each integrated circuit of the group, each receiving unit being configured to receive from the corresponding integrated circuit over said second physical communication channel a corresponding test response signal based on the received test stimuli;

means for exchanging, over at least one third physical communication channel, at least one further signal with each integrated circuit of the group; and means for combining said test stimuli with the at least one further signal over said at least one third physical communication channel, wherein the transmission unit is configured to exchange the test stimuli by modulating at least one first carrier wave based on said test stimuli, the test response signals of each integrated circuit of the group being exchanged by modulating at least one respective second carrier wave based on said test response signals, the at least one first carrier wave having at least one first frequency and each second carrier wave having at least one respective second frequency.

15. The test equipment of claim 14, wherein said at least one third physical communication channel coincides with at least one among the first communication channel and each second communication channel, said first frequency and said at least one second frequencies being not included into the frequency spectrum of the at least one further signal.

16. A method comprising:
forming a plurality of communication channels between test equipment and a plurality of integrated circuits to be tested, the plurality of communication channels being formed between a transmitter and a plurality of receivers of the test equipment and a terminal of each of the plurality of integrated circuits to be tested, each receiver of the plurality of receivers corresponding to an integrated circuit of the plurality of integrated circuits;

transmitting, with the transmitter and via the plurality of communications channels, at least one test stimulus from the test equipment to the plurality of integrated circuits, wherein transmitting the at least one test stimulus comprises modulating a first carrier wave having a first frequency with the at least one test stimulus; and receiving, with the plurality of receivers of the test equipment, a plurality of test responses from the plurality of integrated circuits, wherein receiving the plurality of test responses comprises extracting a plurality of components from a signal, each component of the plurality of components of the signal having a frequency different from frequencies of other components of the plurality of components and comprising a test response generated by an integrated circuit of the plurality of integrated circuits.

17. The method of claim 16, wherein transmitting the at least one test stimulus from the test equipment to the plurality of integrated circuits comprises transmitting the at least one test stimulus to the plurality of integrated circuits in parallel.

18. The method of claim 16, wherein:
forming the plurality of communication channels comprises bringing into contact a probe of the test equipment and a terminal of an integrated circuit; and
transmitting the at least one test stimulus to the integrated circuit and receiving a test response from the integrated circuit comprises transmitting and receiving via the probe and the terminal.

19. The method of claim 16, wherein:
forming the plurality of communication channels comprises bringing into contact two or more probes of the test equipment and two or more terminals of an integrated circuit; and
transmitting the at least one test stimulus to the integrated circuit and receiving a test response from the integrated circuit comprises transmitting and receiving via the two or more probes and the two or more terminals.

20. The method of claim 16, wherein:
the test equipment comprises a filter unit, the filter unit comprising an input, a plurality of filters electrically connected to the input, and a plurality of outputs, each output of the plurality of outputs electrically connecting a filter of the plurality of filters and a receiver of the plurality of receivers; and
receiving the plurality of test responses comprises:
receiving the signal at the input of the filter unit,
extracting the plurality of components from the signal using the plurality of filters of the filter unit, and
providing the plurality of components to the plurality of receivers via the plurality of outputs of the filter unit, wherein each component of the plurality of components is extracted by a filter and output to a receiver via an output of the plurality of outputs.

21. The method of claim 20, wherein:
each integrated circuit of the plurality of integrated circuits is configured to produce a signal having a frequency and comprising a test response;
each filter of the plurality of filters of the filter unit of the test equipment corresponds to an integrated circuit of the plurality of integrated circuits and is arranged to permit signal components having the frequency with which the corresponding integrated circuit is configured to pass from the input of the filter unit to an output of the filter unit; and
processing the signal using the plurality of filters of the filter unit comprises processing the signal such that a filter of the plurality of filters permits a component of the signal comprising a test response signal produced by an integrated circuit to which the filter corresponds to pass from the input of the filter unit to a receiver corresponding to the integrated circuit via an output of the plurality of outputs of the filter unit.

22. The method of claim 16, further comprising:
reviewing the plurality of test responses to determine whether any of the plurality of integrated circuits are faulty.

23. The method of claim 16, further comprising:
providing a power supply signal to the plurality of integrated circuits via the plurality of communication channels,
wherein:
forming the plurality of communication channels comprises bringing into contact a probe of the test equipment and a terminal of an integrated circuit, and
providing the power supply signal comprises providing the at least one test stimulus and the power supply signal to the integrated circuit via the probe and the terminal.

24. The method of claim 23, wherein providing the at least one test stimulus and the power supply signal to the integrated circuit via the probe and the terminal comprises providing the at least one test stimulus and the power supply signal to the integrated circuit at the same time.

25. The method of claim 23, wherein the power supply signal is a ground signal.

26. An apparatus comprising:
a plurality of probes to contact a plurality of terminals of a plurality of integrated circuits to be tested to form a plurality of communication channels between the apparatus and the plurality of integrated circuits;
a transmitter electrically connected to the plurality of probes to transmit, via the plurality of communication channels, at least one test stimulus from the apparatus to the plurality of integrated circuits, wherein the transmitter is adapted to transmit the at least one test stimulus by transmitting a first modulated signal having a first frequency and comprising the at least one test stimulus; and
a plurality of receivers electrically connected to the plurality of probes to receive, via the plurality of communication channels, a plurality of test responses from the plurality of integrated circuits, wherein the plurality of receivers are configured to process a plurality of components from a signal, each component of the plurality of components having a frequency different from frequencies of other components of the plurality of components and comprising a test response generated by an integrated circuit of the plurality of integrated circuits.

27. The apparatus of claim 26, wherein the transmitter is adapted to transmit the at least one test stimulus to the plurality of integrated circuits in parallel.

28. The apparatus of claim 26, wherein:
the transmitter is adapted to transmit the at least one test stimulus to an integrated circuit via a probe of the plurality of probes contacting a terminal of the integrated circuit; and
a receiver of the plurality of receivers is adapted to receive a test response from the integrated circuit via the probe contacting the terminal of the integrated circuit.

29. The apparatus of claim 26, wherein:
the transmitter is adapted to transmit the at least one test stimulus to an integrated circuit via two or more probes of the plurality of probes contacting two or more terminals of the integrated circuit; and
a receiver of the plurality of receivers is adapted to receive a test response from the integrated circuit via the two or more probes contacting two or more terminals of the integrated circuit.

30. The apparatus of claim 26, further comprising:
a filter unit comprising an input, a plurality of filters electrically connected to the input, and a plurality of outputs, each output of the plurality of outputs electrically connecting a filter of the plurality of filters to a receiver of the plurality of receivers,
wherein the filter unit is adapted to receive the signal at the input of the filter unit, extract the plurality of components from the signal using the plurality of filters, and prove the plurality of components to the plurality of receivers via the plurality of outputs of the filter unit,
wherein each component of the plurality of components is extracted by a filter of the plurality of filters and output to a receiver via an output of the plurality of outputs of the filter unit.

31. The apparatus of claim 30, wherein:
each integrated circuit of the plurality of integrated circuits is configured to produce a signal having a frequency and comprising a test response;
each filter of the plurality of filters of the filter unit corresponds to an integrated circuit of the plurality of integrated circuits and is arranged to permit signal components having the frequency with which the corresponding integrated circuit is configured to pass from the input of the filter unit to an output of the filter unit.

32. The apparatus of claim 26, further comprising:
a processing circuit to review the plurality of test responses to determine whether any of the plurality of integrated circuits are faulty.

33. The apparatus of claim 26, further comprising:
a power source connected to at least some of the plurality of probes.

34. The apparatus of claim 33, wherein:
the power source is connected to a first probe of the plurality of probes to provide a power supply signal via the first probe; and
the transmitter is connected to the first probe.

35. The apparatus of claim 34, wherein the transmitter is adapted to transmit the at least one test stimulus via the first probe at a same time that the power source is providing the power supply signal via the first probe.

36. The apparatus of claim 35, wherein the power supply signal is a ground signal.

\* \* \* \* \*

UNITED STATES PATENT AND TRADEMARK OFFICE
CERTIFICATE OF CORRECTION

PATENT NO. : 8,358,147 B2
APPLICATION NO. : 12/982753
DATED : January 22, 2013
INVENTOR(S) : Alberto Pagani Page 1 of 1

It is certified that error appears in the above-identified patent and that said Letters Patent is hereby corrected as shown below:

Col. 20, line 42, should read:
possible short circuits in the IC dies 105A, 105B. Said pro- Col. 20, line 64, should read:
operation of the ICs of the IC dies 105A, 105B, the frequen- Col. 23, line 19, should read:
105A, 105B is provided with four pads adapted to receive the Col. 23, line 37, should read:
105A, 105B is provided with three pads adapted to receive the Signed and Sealed this
Twenty-sixth Day of February, 2013

Teresa Stanek Rea
*Acting Director of the United States Patent and Trademark Office*